United States Patent [19]
Lee et al.

[11] Patent Number: 6,023,188
[45] Date of Patent: Feb. 8, 2000

[54] POSITIVE/NEGATIVE HIGH VOLTAGE CHARGE PUMP SYSTEM

[75] Inventors: Peter W. Lee, Saratoga, Calif.; Hsing-Ya Tsao; Fu-Chang Hsu, both of Taipei, Taiwan

[73] Assignee: APLUS Flash Technology, Inc., Santa Clara, Calif.

[21] Appl. No.: 09/232,115

[22] Filed: Jan. 15, 1999

[51] Int. Cl.[7] .................................................... G05F 3/02
[52] U.S. Cl. ........................................... 327/536; 327/537
[58] Field of Search ................................... 327/534, 535, 327/536, 537; 307/110

[56] References Cited

U.S. PATENT DOCUMENTS

| | | | |
|---|---|---|---|
| 4,186,436 | 1/1980 | Ishiwatari | 363/60 |
| 5,039,877 | 8/1991 | Chern | 327/536 |
| 5,140,182 | 8/1992 | Ichimura | 327/536 |
| 5,306,954 | 4/1994 | Chan et al. | 363/60 |
| 5,396,114 | 3/1995 | Lee et al. | 327/535 |
| 5,489,870 | 2/1996 | Arakawa | 327/536 |
| 5,546,044 | 8/1996 | Calligaro et al. | 327/543 |
| 5,668,710 | 9/1997 | Caliboso et al. | 363/60 |
| 5,812,018 | 9/1998 | Sudo et al. | 327/537 |

*Primary Examiner*—Terry D. Cunningham
*Attorney, Agent, or Firm*—Flehr Hobach Test Albritton & Herbert LLP

[57] ABSTRACT

A two-phase high voltage generator circuit is electronically reconfigurable to output positive ($V_{Pp}$) or negative ($V_{Pn}$) high voltage, depending upon whether positive or negative mode operation is selected. The circuit includes a plurality of series-connected charge multiplier stages that each comprises a MOS transistor and a charging capacitor. Collectively the stages define an anode node and a cathode node. One of two non-overlapping phase signals is coupled to the free end of each charging capacitor such that adjacent charging capacitors are driven by different phases. First and second two-way multiplexers (MUX1, MUX2) control voltages presented to the anode and cathode nodes, to determine whether circuit operation is positive or negative mode. The MOS devices may be PMOS or NMOS, and preferably Vt-cancellation is provided for each charging stage. A precharge/discharge circuit preferably is coupled to each voltage node including the load capacitor. Further, substrate-well protection is provided such that the MOS devices are less prone to exhibit voltage breakdown or substrate to source/drain current flow.

20 Claims, 15 Drawing Sheets

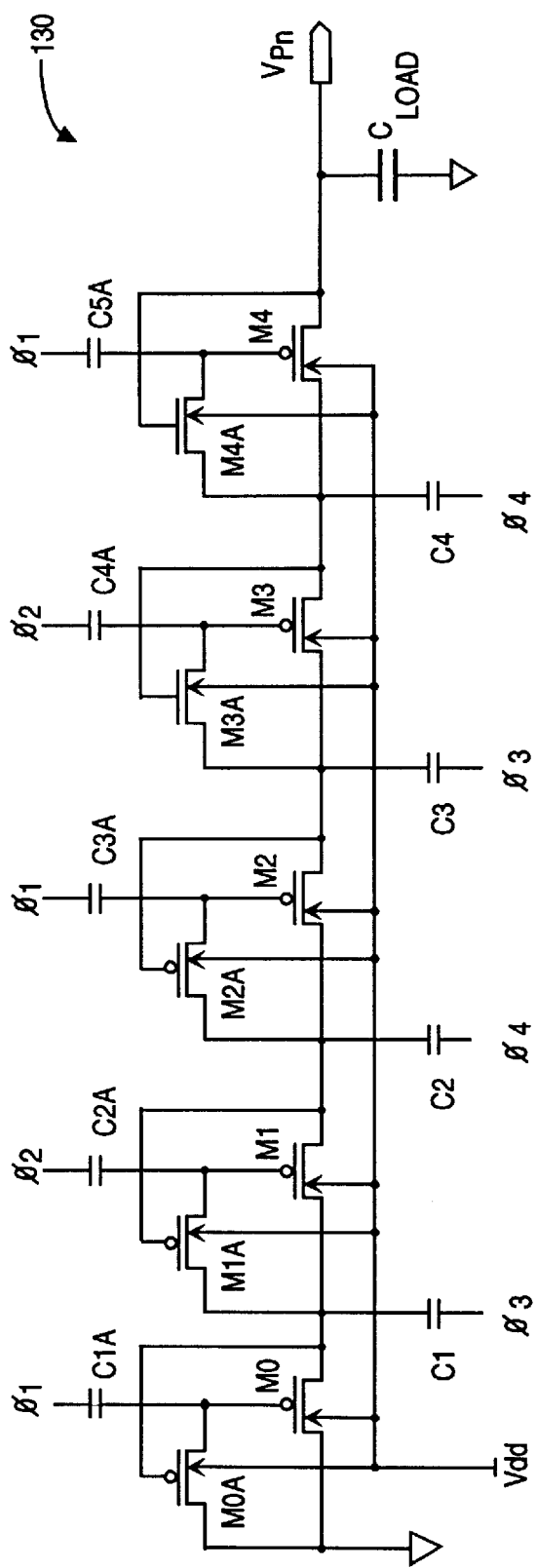
FIGURE 3C (PRIOR ART)
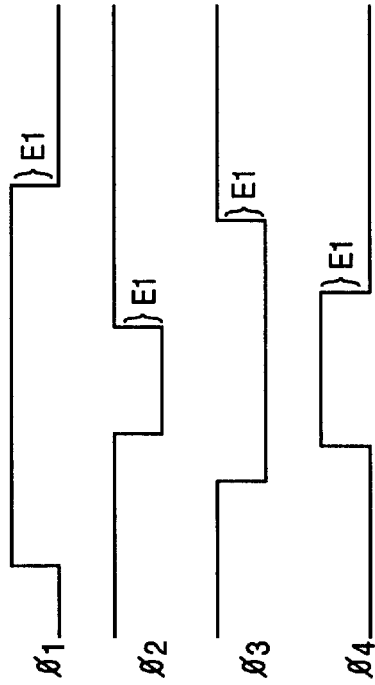
FIGURE 3D
FIGURE 3E
FIGURE 3F
FIGURE 3G

POSITIVE/NEGATIVE HIGH VOLTAGE CHARGE PUMP SYSTEM

FIELD OF THE INVENTION

The present invention relates to charge pump circuits that step-up voltage levels used to program and erase flash EPROM and EEPROM circuits, and more specifically to charge pump circuits for outputting stepped-up positive or negative voltage levels.

BACKGROUND OF THE INVENTION

Flash electrically programmable read only memories ("EPROMs") and flash electrically erasable and programmable read only memories ("EEPROMs") are solid state devices that can persistently store digital data. As shown by FIG. 1, an EPROM-type flash cell 10 typically has a metal-on-silicon ("MOS") structure that includes a substrate 12, source and drain regions 14, 16, a floating gate 18 overlying MOS channel region 20 but separated therefrom by a thin layer region 22 of oxide 24. A control gate 26 is formed overlying floating gate 18. For a flash EPROM, it is necessary to surround the source region with a lightly doped region 15 of like-conductivity type dopant. The substrate or bulk 12 is tied to a potential Vbb that typically is ground. For the NMOS device depicted, substrate 12 is doped with P-type impurities, and the source and drain regions are doped with N-type impurities. For a flash EPROM, N+ source region 14 is surrounded by an N− region 15. The N− region 15 is included to protect the source junction from the large source-floating gate electric field used to electrically erase the cell. But for the presence of this N− region, the magnitude of the electric field during erase operations could damage the source region.

Of course a PMOS device may be formed by substituting an N-type substrate, and P-type source, drain regions. Generally, NMOS devices are preferred to PMOS devices in that the majority carriers in NMOS devices, electrons, have 2.5 times the mobility of the majority carriers, holes, in PMOS devices, and thus can operate more rapidly. Although a flash-type EPROM cell is depicted, it is to be understood that the present invention may also be used with EPROM, or EEPROM type memory as well.

A Vcg voltage coupled to control gate 26 can affect charge stored on floating gate 18, which charge affects the Vt threshold voltage of MOS device 10. The magnitude of charge on the floating gate controls the minimum (or Vt) voltage Vcg that will turn-on device 10, causing drain-source current to flow across the channel region 20. Device 10 is programmed to one of two states by accelerating electrons from substrate channel region 20 through the thin gate dielectric 22 region onto floating gate 18.

The state of device 10, e.g., how much charge is stored on floating gate 18, is read by coupling an operating voltage Vgs across source and drain regions 14, 16, and then reading the drain-source current Ids to determine whether the device is ON or OFF for a given control voltage level Vcg.

To program a flash EPROM (or to erase a flash EEPROM, whose definitions of erasing and programming are opposite) it is necessary to apply a positive high voltage Vcg, e.g., perhaps +10 VDC to control gate 26, while applying perhaps +5 VDC to drain 16, and 0 VDC to source 14. As hot electrons are accelerated and travel from source to drain, the electric field created by the high Vgs and Vds voltages can pull some hot electrons from the drain to the floating gate. (No electrons will be pulled to the floating gate from the source, which is at ground potential.)

On the other hand, to erase a flash EPROM (or to program a flash EEPROM), it is necessary to apply a negative high voltage Vcg, e.g., perhaps −10 VDC, and a positive Vs or perhaps +5 VDC, while allowing Vd to float. The negative Vcg high voltage and Vs produce a large tunnel electric field that can push electrons from the floating gate 18 to the source 14. (No electrons are pulled out of the floating gate to the drain, as the floating drain will not generate a large electric field.) Although one can erase a flash EPROM by providing positive high voltage to the source and grounding the control gate, so doing increases source region junction leak current, and increases hot-hole injection at the source region. Unfortunately, this causes hole trapping, and degrades the storage capability and endurance of the memory cell.

Typically the circuitry with which memory cells 10 are used is powered by a single low voltage power supply, a 3.3 VDC battery for example, although batteries ranging from perhaps 1.2 VDC to 5 VDC or higher may instead be used. As will be described, positive and negative high voltage pump circuits are commonly used to generate the +10 V or so high voltage necessary to program and erase memory cells from a single lower voltage power supply.

As shown in FIG. 2, it is common to form an integrated circuit ("IC") 100 that includes a plurality of cells 10 that are arrayed in addressable rows and columns that define a storage array 110. Address logic 120 permits accessing a specific cell in such an array. For example, during a program/read or erase operation, a given cell 10 may be accessed by applying the proper Vgs, Vd, Vs potentials to all cells in a column containing the addressed cell, and to the row containing the addressed cell. For ease of illustration, address logic 120 is shown as having a single output lead, but in practice there will be multiple output leads, including leads for Vgs, Vd, and Vs.

As shown in FIG. 2, IC 100 preferably operates from a single low voltage power supply Vdd, which may be a battery if, for example, IC 100 is a storage unit within a laptop computer. Typically the low voltage power supply magnitude is 5 VDC, although the trend has been toward lower voltage magnitudes, e.g., 3.3 VDC or 2.5 VDC, with a goal of perhaps 1.2 VDC.

To generate the high voltage necessary to program or erase the various cells, IC 100 will include a positive high voltage pump circuit 130 that outputs a high positive potential $V_{Pp}$, and a negative high voltage pump circuit 140 that outputs a high negative potential $V_{Pn}$. IC 100 also includes a phase generator circuit 150 that outputs a plurality of non-overlapping different phase pulse trains that drive the positive and negative pump circuits. Many prior art high voltage pump circuits require phase generators that provide four-phase output pulse trains, denoted ø, ø2, ø3, ø4.

Understandably the necessity to fabricate both positive and negative pump circuits on IC 100 requires IC chip area that might otherwise be available for other circuitry, more memory cells for example. Also, if phase generator 150 must output many multiply-phased non-overlapping pulse train signals, the phase generator circuitry may be complex will consume IC chip-area. Further, as more phases are required to be generated, the practical upper frequency of the phase generator output signals decreases, due to the necessity that the various phase signals not overlap each other at their voltage transitions.

FIG. 3A depicts a prior art five-stage positive high voltage so-called Dickson charge pump, such as might be used for circuit 130. Details of this configuration may be found in "On-Chip High-Voltage Generation in NMOS Integrated Circuits Using an Improved Voltage Multiplier Technique", Dickson, J., IEEE J. Solid State Circuits, vol. 11, pp. 374–378, June 1976. In this configuration, a plurality of voltage pump or multiplier or rectifier stages is formed, each comprising an NMOS used as a diode, and an associated charging capacitor. Each NMOS transistor has its gate and source leads coupled together, with the result that Vgs=0 VDC. The substrate or bulk potential Vbb is typically ground, or 0 VDC, to prevent the P-substrate, N-source/drain regions from becoming a current conducting forward-biased PN junction. The gate-source of M0 may be said to define the anode node for the string of rectifier stages, and the drain of M5 may be said to define the cathode node for the string of rectifier stages. In FIG. 3A, the anode node is coupled to the low voltage power supply Vdd.

In the configuration shown, two-phase non-overlapping pulse trains ø1, ø2 are provided, for example from a phase generator 150. By non-overlapping it is meant that 0 to 1, and 1 to 0 voltage transitions of one phase never overlap with transitions of the other phase, although duty cycle of the two phases is not critical. As shown in FIG. 3A, each waveform has a 0 to 1 voltage differential E1 that typically is equal to Vdd. Assume that Vdd=E1=3.3 VDC.

FIG. 3B shows the equivalent circuit of FIG. 3A, such that the leftmost transistor M0 in FIG. 3A corresponds to equivalent diode D0 in FIG. 3B, M1 corresponds to D1, and so on. In FIG. 3B, assume that node A is initially at (Vdd–Vt) or about (3.3–1)=2.3 VDC potential, where Vt is the equivalent diode voltage drop, where Vt here is assumed to be about 1 VDC.

In reality, the "diode drop" will be a Vt threshold voltage drop of perhaps 1 VDC for the NMOS transistors used in the circuit. This Vt drop will always be present because the gate potential can never be more positive than the source potential (since Vgs=0). In stating that Vt≈1 V, a simplifying assumption is made that no MOS body effect is present. In practice, Vt may be 2 V or so rather than 1 V, due to body effect induced by higher pumped voltages with respect to ground potential. Thus, where Vt≈1 V is assumed, it must be remembered that body effect contributions are not being accounted for.

The rising edge of waveform ø1 AC-couples through capacitor C1 to superimpose a positive transition of magnitude E1 (e.g., +3.3 VDC) upon the 2.3 VDC potential, raising node A to a peak voltage of +5.6 V. Node B will follow the potential at node A less a D1 diode drop of 1 VDC, and will see (5.6–1)=4.6 VDC. However the positive-going transition of the ø2 waveform AC-couples through capacitor C2 to initially superimpose an E1=3.3 V transition upon node B, increasing the peak node potential to (4.6+3.3)=7.9 VDC.

Node C will follow this potential, less a 1 VDC D2 diode voltage drop, which puts the peak node C potential at 6.9 VDC. However, the positive-going transition of the ø1 waveform AC-couples through capacitor C3, increasing the node C potential by 3.3 V to (6.9+3.3)=10.2 VDC. Similarly, in this example, node D will follow this potential less a D3 diode voltage drop, and will be 9.2 VDC, until the positive-going transition of the ø2 waveform AC-couples through capacitor C4 to increase the potential to 12.5 VDC peak. Waveform E will be one diode D4 voltage drop lower, or 11.5 VDC, until the positive-going transition of ø1 increases the potential to 14.8 VDC. The peak positive output voltage $V_{Pp}$ at node F will be one diode D5 voltage drop lower, or about +13.8 VDC.

Of course, the above description neglects body effect in the various transistors, and results in too high an output voltage $V_{Pp}$. More realistically, if a Vt≈2 V (rather than 1 V) is assumed to better account for body effects, $V_{Pp}$ at node F in FIG. 3B will be closer to about +7.8 VDC, rather than +13.8 VDC. In reality, each of M0, M1, M2, M3, M4 and M5 can have a different Vt value. For example, M0 will experience the smallest body effect contribution and will exhibit the smallest Vt, perhaps about 1 V. M5, on the other hand, sees the largest potentials and will experience the largest body effect contribution, and will exhibit the largest Vt, perhaps about 2 V. Depending upon MOS fabrication process variations, the $V_{Pp}$ output from FIG. 3A will range from about 7.8 VDC upward to but not exceeding about 13.8 VDC.

In the configuration of FIG. 3B, Typically the various capacitors coupling capacitors C1–C5 are in the 10–20 pF range, depending upon the driving current requirements and magnitude of load capacitor $C_{LOAD}$, which will be substantially larger, perhaps in the 1000 pF range.

Although the Dickson configuration of FIG. 3A works, it is not very efficient because of the diode drop associated with each stage. More stages may be added to boost the output voltage even higher, but on a relative basis even coupling capacitors in the 2 pF to 10 pF range require not insubstantial IC chip area.

FIG. 3C shows a four-phase prior art four-stage negative high voltage charge pump, such as might be used for circuit 140, as disclosed in U.S. Pat. No. 5,077,691 to Haddad et al. Series-coupled PMOS transistors M0, M1, M2, M3, and M4 associated charge capacitors form a plurality of voltage rectifier stages. Together, capacitor C1 and PMOS M1 comprise a first pumping stage, capacitor C2 and PMOS C2 comprise a second pumping stage, and so-on. FIG. 3C is typical of prior art negative high voltage generators in that PMOS transistors are employed. Understandably, however, NMOS transistors would be preferred to PMOS devices because of the higher mobility associated with electrons in NMOS transistors.

One interesting aspect of this configuration is that charge-switching transistors M0A, M1A, M2A, M3A, and M4A and associated capacitors C1A, C2A . . . C5A, essentially eliminate the Vt threshold drop otherwise present in the associated string of series-coupled PMOS transistors. In essence, the charge-switching transistors can couple the gate and source leads of the associated series-coupled PMOS transistors, without imposing a Vgs=0 condition as in FIG. 3A. The result is that the gate potential of the series-coupled PMOS transistors can float at a potential several volts more negative than the source lead potential. The result is that the full E1 magnitude potential swing of the phase pulse trains can be coupled from drain-to-source across each series-coupled PMOS transistor, without incurring a Vt loss. In the following example, assume that Vdd=E1=3.3 VDC.

The Vt cancelling aspect of the Haddad et al. circuit is achieved as follows. The rising edge of waveform ø3 is AC-coupled via capacitor C1 to the gate of transistor M0A, where the gate voltage will initially be clamped to about |1V| of PMOS threshold voltage Vtp. But the falling edge of waveform ø1 AC-couples a transient to the gate of M0 of E1≈Vdd≈3.3 V. This –3.3 V gate voltage permits M0 to pass a potential at virtual ground from its source-to-drain to the gate of M0A without a |Vtp| threshold voltage drop (typically≈1 V). When the falling edge of ø3 AC-couples to the gate of M0A, a peak negative voltage of about –3.3 V is achieved at the upper end of C1A. In similar fashion, the following three stages (C2, C3, C4 and associated transistors) multiply the negative potential. Assuming that body effect may be neglected, approximately $-(4)\times(3.3V)+Vt=-(13.2+1)$ or 12.2 VDC appears across $C_{LOAD}$. The +1 V Vt offset accounts for the initial gate potential at M0 being approximately +1 VDC rather than ground.

The advantage of the PMOS configuration of FIG. 3C is that voltage multiplication efficiency is high relative to the configuration of FIG. 3A. In FIG. 3C, if E1 is 3.3 V, and there are 5 rectification stages, the peak negative output voltage $V_{Pn}$ will be approximately $-(5)\times(3.3\ V)+1\ V\approx-15.5$ V. Again, this magnitude of $V_{Pn}$ is optimistic in that body effects have not been fully accounted for.

While eliminating Vt improves charge pump efficiency, unfortunately the Haddad et al. circuit requires four non-overlapping phase signals, ø1, ø2, ø3, ø4, such as shown in FIGS. 3D–3G. As noted, having to output four non-overlapping phase signals adds design complexity to phase generator 150, requires additional IC chip area to implement, and reduces the frequency of each phase signal. For example, the two-phase configuration of FIG. 3A may utilize a phase signal having perhaps a 5 MHz repetition rate. By contrast, the configuration of FIG. 3C will have to utilize phase signals having substantially lower repetition rates, assuming that the phase generator 150 in each instance is functioning at maximum frequency without phase overlap. Thus, the two-phase configuration of FIG. 3A can pump substantially faster than the four-phase configuration of FIG. 3C, and will exhibit improved pump performance.

Neither prior art FIG. 3A nor 3C provides for discharging the capacitor-MOS interconnection nodes, or for precharging these nodes. Discharging, if implemented, can be advantageous in permitting the capacitor node voltage to be reset. On the other hand, precharging, if implemented, could allow the circuits to more rapidly achieve a steady-state high voltage output. Further, neither of these circuits takes special care to protect the MOS substrate from undesired high voltage conditions. Such conditions can give rise to leakage currents and/or damage to the MOS transistors.

With respect to FIG. 2, it will be appreciated that there is a need for a single high voltage pump circuit that could output positive high voltage or negative high voltage. Such a circuit would save considerable IC chip area. Further, such a positive/negative high voltage pump circuit should operate with fewer than four phases, to simply design of the phase generator, thus saving additional IC chip area and permitting faster repetition rate phase signals. Such a positive/negative high voltage pump circuit should provide an option for cancelling Vt voltage drops, to promote efficiency, preferably using less than four phases. Further, such a pump circuit should provide an option for precharging or discharge capacitor voltage nodes, and for protecting the MOS substrates.

In summary, what is needed is a pump circuit that can rapidly boost low voltage Vdd to high positive or negative voltage, using the least number of charge pump stages, while utilizing relatively small IC chip area. Preferably such circuit should permit implementing precharge and discharge of capacitor nodes, and should provide protection for the substrates of MOS devices used to implement the circuit.

The present invention discloses such a positive/negative high voltage charge pump circuit.

SUMMARY OF THE PRESENT INVENTION

The present invention provides a two-phase high voltage generator circuit that is electronically reconfigurable to output from an output port either positive or negative high voltage, depending upon whether positive or negative mode operation is selected. The circuit includes a plurality of series-connected charge multiplier or rectifier stages. Each stage comprises a MOS transistor and a charging capacitor, and collectively the string of rectifier or pump stages has an anode node and a cathode node. One of two non-overlapping phase signals is coupled to the free end of each charging capacitor such that adjacent charging capacitors are driven by different phases. The circuit preferably also includes first and second two-way multiplexers (MUX1, MUX2) that control voltages presented to the anode and cathode end of the rectifier string. Whether the circuit operates in positive mode and outputs positive high voltage $V_p$p, or operates in negative mode and outputs negative high voltage $V_{Pn}$ is determined by the MUXs.

The first input nodes of MUX1 and MUX2 are coupled together and to positive $V_{dd}$ if the circuit is to output high positive voltage, or to ground if the circuit is to output high negative voltage. The second input nodes of MUX1 and MUX2 are coupled together and to the load capacitor ($C_{LOAD}$) to be driven. The voltage delivered to $C_{LOAD}$ is the peak $V_{Pp}$ or $V_{Pn}$ high voltage output by the circuit. The MUX1 output is coupled to the anode node of the pump string, and the MUX2 output is connected to the cathode node of the pump string.

When the circuit is to output positive high voltage, MUX1 connects together its output node and its first input node, which provides Vdd to the anode node of pump string. MUX2 connects together its output node and its second input node, which delivers $V_{Pp}$ from the cathode node of the pump string to $C_{LOAD}$. In positive high voltage mode, the MUXs couple Vdd to the NMOS substrates to prevent substrate-source/drain current flow, and preferably precharge $V_{Pp}$ up to Vdd-Vtn to save charge time.

When the circuit is to output negative high voltage, the MUX1 output node is connected to its second input node, which will deliver $V_{Pn}$ to $C_{LOAD}$. The MUX2 output node is connected to its first input node, which is connected to ground. In negative high voltage mode, the MUXs couple the NMOS substrates to ground to prevent substrate-source/drain current flow, and precharge $V_{Pn}$ to Vtp.

Preferably Vt cancellation is provided for each series-connected MOS transistor in the rectifier stages by connecting cross-coupled diodes implemented as charge-switching MOS transistors between the gate and source leads of the rectifying MOS. The gate and source of the first charge-switching MOS transistor and the drain of the second are AC-coupled through a separate charge capacitor to the complement of the non-phase signal that is AC coupled to the gate of the rectifying MOS. The gate and source of the second charge-switching MOS transistor and the drain of the first are coupled to the gate of the rectifying MOS transistor. Preferably the series-connected rectifying transistors and the charge-switching transistors are all NMOS devices whose substrates are tied to a common substrate node.

In preferred embodiments, capacitor voltage nodes may be precharged and/or discharged, and MOS device substrates are protected against forward bias current conditions.

Other features and advantages of the invention will appear from the following description in which the preferred embodiments have been set forth in detail, in conjunction with the accompanying drawings.

BRIEF DESCRIPTION OF THE DRAWINGS

FIG. 3C depicts a Haddad et al.-type four-phase driven negative high voltage pump circuit, according to the prior art;

FIGS. 3D–3G depict exemplary non-overlapping four-phase pulse trains ø1, ø2, ø3, ø4 such as are used with the Haddad et al. circuit of FIG. 3C;

DETAILED DESCRIPTION OF THE PREFERRED EMBODIMENTS

Figure 4A:
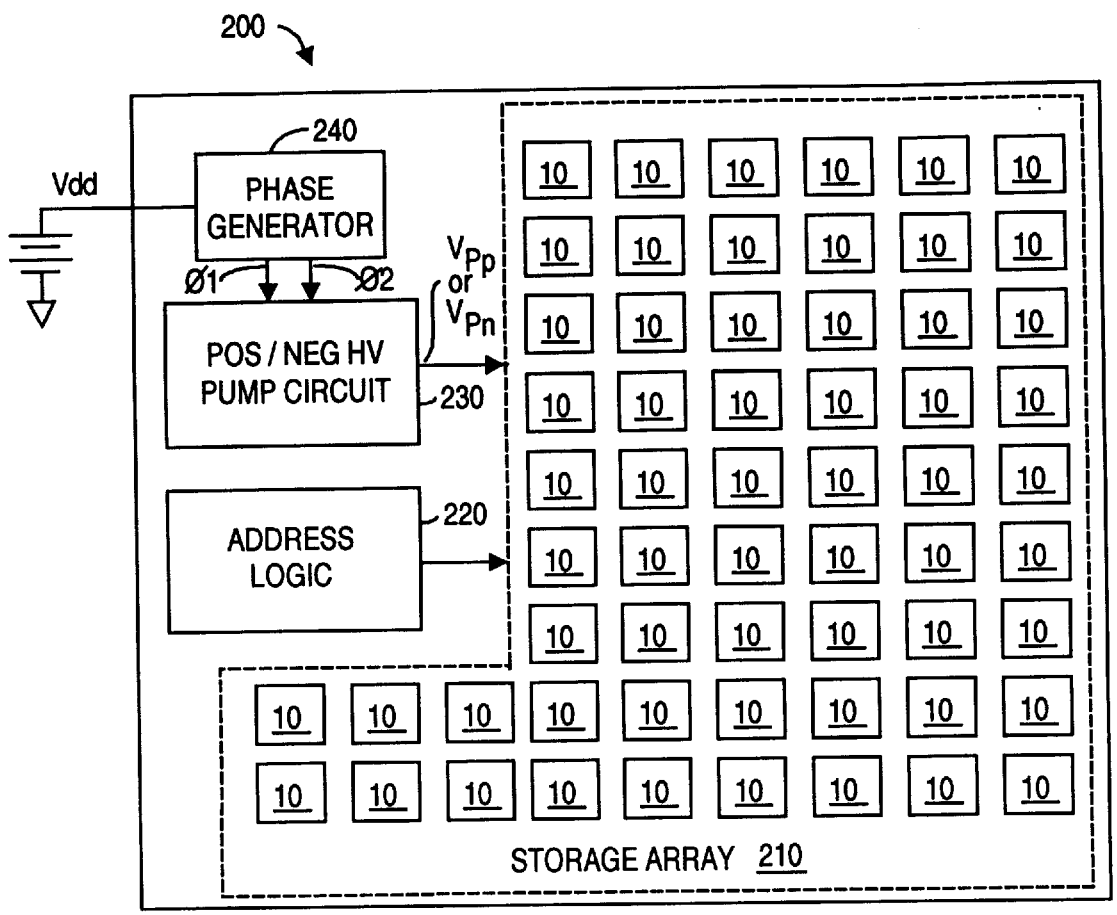
FIG. 4A depicts an IC including a positive/negative high voltage pump circuit according to the present invention and a less complex two-phase phase generator, in which more IC chip area is available for an expanded array of storage cells.

FIG. 4A depicts an IC 200 that includes a plurality of cells 10 that are arrayed in addressable rows and columns that define a storage array 210. Similar to what was described with respect to prior art FIG. 2, address logic 220 permits accessing a specific cell in such an array. In contrast to FIG. 2, however, IC 200 includes a single high voltage pump circuit 230 that can output positive high voltage or negative high voltage, depending upon whether a program/read or erase operation is to be undertaken. Note too that phase generator 240 now outputs only two phases, ø1, ø2, to drive the positive/negative high voltage pump circuit 230.

Figure 1:
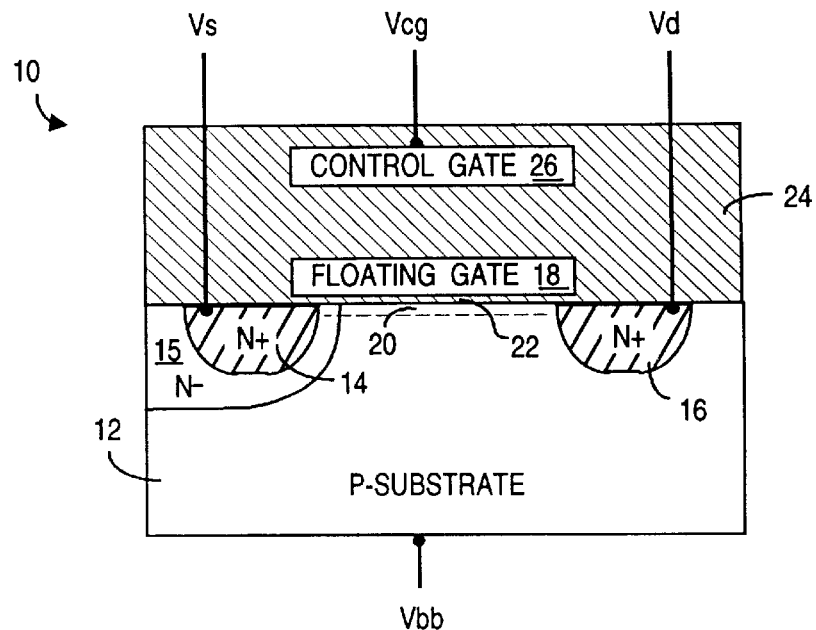
FIG. 1 depicts a conventional EPROM/EEPROM-type storage cell, according to the prior art.
Figure 2:
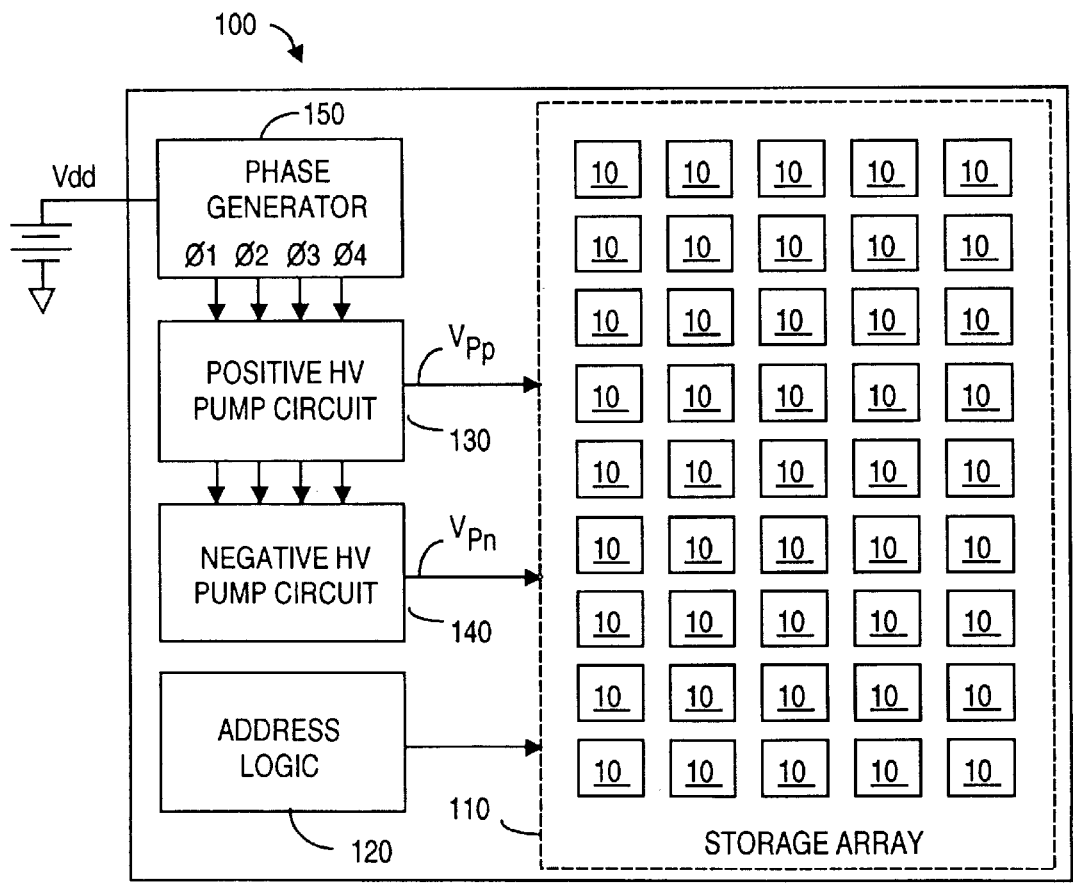
FIG. 2 depicts an IC including positive and negative high voltage pump circuits, a multi-phase generator, and an array of storage cells, according to the prior art.

Symbolically the size of two-phase phase generator 240 is shown smaller than what was shown for the four-phase phase generator 150 of prior art FIG. 2, to reflect that generator 240 advantageously is less complex and can be fabricated on less IC chip area. Note too that symbolically, array 210 now includes more cells 10. Array 210 can be larger, or alternatively IC 200 can be smaller, because the single positive/negative positive/negative high voltage pump circuit 230 replaces two separate high voltage pump circuits, thus saving considerable IC chip area.

Figure 3A:
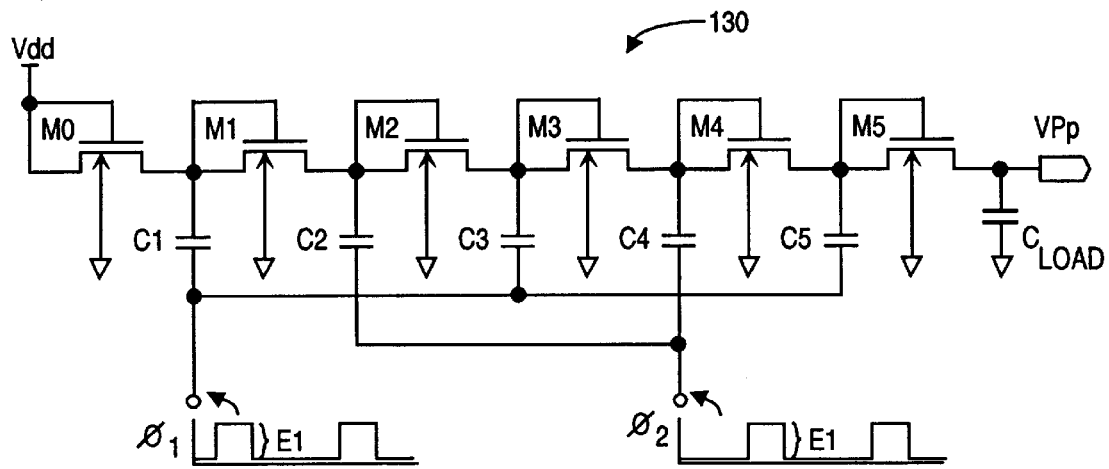
FIG. 3A depicts a Dickson-type two-phase driven positive high voltage pump circuit, according to the prior art.
Figure 4B:
FIGS. 4B and 4C depict exemplary non-overlapping two-phase pulse trains ø1, ø2, such as may be used with the present invention.
Figure 4C:

FIGS. 4A and 4B depict generic non-overlapping two-phase pulse trains ø1, ø2, such as may be used to drive positive/negative high voltage pump circuit 230. Each of these pulse trains has a 0 to 1 amplitude differential of E1 volts, where E1≈Vdd. In practice, Vdd may range from as low as about 1.2 VDC to 5 VDC or higher. Because more circuitry is designed to be battery operated, laptop computers for example, the trend is to operate ICs from as low a magnitude Vdd as is feasible, to reduce switching currents, and to extend battery lifetime. Duty cycle of ø1, ø2 is relatively unimportant providing waveform transitions of one pulse train do not coincide with waveform transitions of the other pulse train. Further, the two pulse trains may have dissimilar duty cycles. In the preferred embodiment, the repetition rate frequency of each pulse train may range from about 10 MHz to 20 MHz or higher. This frequency range is twice as fast as what is permissible using the four-phase Haddad et al. configuration shown in FIG. 3A.

Figure 5A:
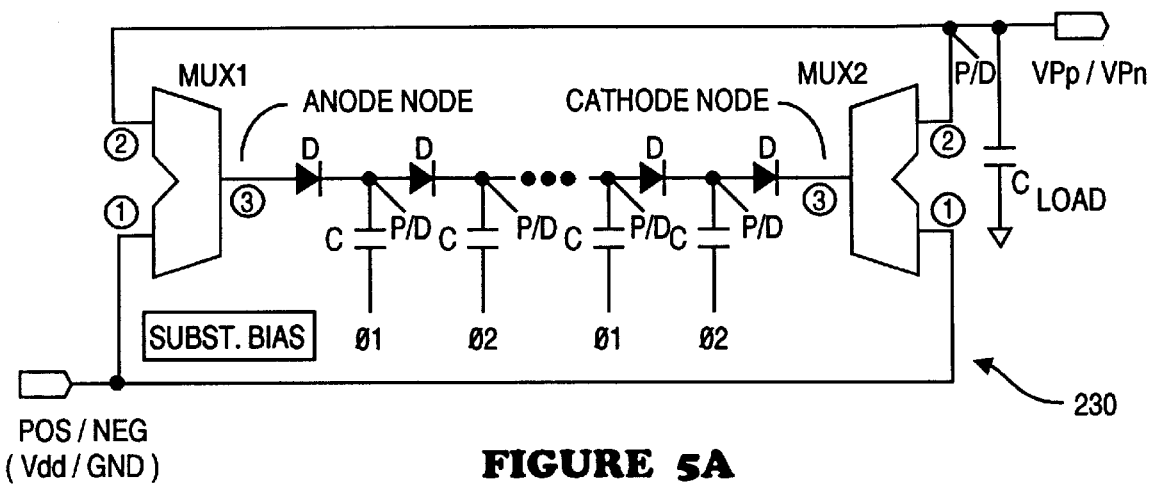
FIG. 5A is a generic block diagram of a two-phase positive/negative high voltage pump circuit with precharge/discharge option and with substrate protection option, according to the present invention.

FIG. 5A depicts generically the architecture of a two-phase positive/negative high voltage pump circuit 230, according to the present invention. Circuit 230 includes a plurality of series-connected rectifier or pump stages, each stage comprising a MOS transistor and a charging capacitor. For ease of understanding, in FIG. 5A these MOS transistors are shown as simple diodes. One of two non-overlapping phase signals ø1, ø2 is coupled to the free end of each charging capacitor such that adjacent charging capacitors are driven by different phases. Circuit 230 also includes first and second two-way multiplexers MUX1, MUX2. The switching configurations provided by these MUXs govern whether circuit 230 outputs positive high voltage $V_Pp$ or negative high voltage $V_{Pn}$. For ease of illustration, FIG. 5A does not depict switching of substrate voltage Vbb for the devices implementing the charging stages, and does not depict precharging.

In FIG. 5A, switches labelled P/D (for precharge/discharge) are shown coupled to capacitor voltage nodes, including the high voltage output port. Symbolically, these switches denote the precharge/discharge options available for the preferred embodiments. Further details of this option are set forth later herein. FIG. 5A also depicts generically the substrate bias protection aspect of the present invention. Further details as to substrate biasing and protection are also set forth in detail herein.

The first input node (node 1) of each MUX is coupled together and is coupled to positive $V_{dd}$, e.g., the low battery or other power supply, if the circuit is to output high positive voltage. However, if the circuit is to output high negative voltage, then nodes 1 of the MUXs are coupled to the most negative power supply, e.g., ground. The second input node (node 2) of each MUX is coupled together, and is coupled to the load capacitor to be driven, $C_{LOAD}$. The voltage at this common second node is the peak $V_{Pp}$ or $V_{Pn}$ high voltage output by the circuit.

As shown in FIG. 5A, the output node (node 3) of MUX1 is coupled to the anode node of the series-connected rectifier or pump stages. The output node (node 3) of MUX2 is connected to the cathode node of the series-connected rectifier stages.

Adjacent rectifier or pumping stages, e.g., a diode D and a capacitor C, are driven by different phased signals, e.g., by ø1 and by ø2 or vice versa, but not by ø1 and ø1, or by ø2 and ø2. The transition edges of the phase signals are AC-coupled through the capacitors and are peak-rectified by the associated diode D, which turns on when forward biased, and is otherwise off. The anode and cathode of a given diode is subjected to AC-coupled signals having different phases. The AC-coupled created voltage differential between a diode's anode and cathode will determine whether current flows. The diode biasing ensures current flow, if any, is unidirectional, such that voltage across the diode-capacitor nodes changes in a common direction, e.g., more positive.

Of course, any floating DC potential at the top lead of the capacitor will be coupled through the diode, subject to a diode drop, more corrected a Vt threshold drop, unless additional components are provided to cancel such drop. Because the peak voltage waveform at the top lead of the various capacitors will decay with time, it is advantageous to operate the various phase signals with a high repetition rate, perhaps 10 MHz to 20 MHz. Understandably, the faster the repetition rate, the less voltage decay before the arrival of the next voltage-enhancing transition edge on the associated phase signal.

Figure 5B:
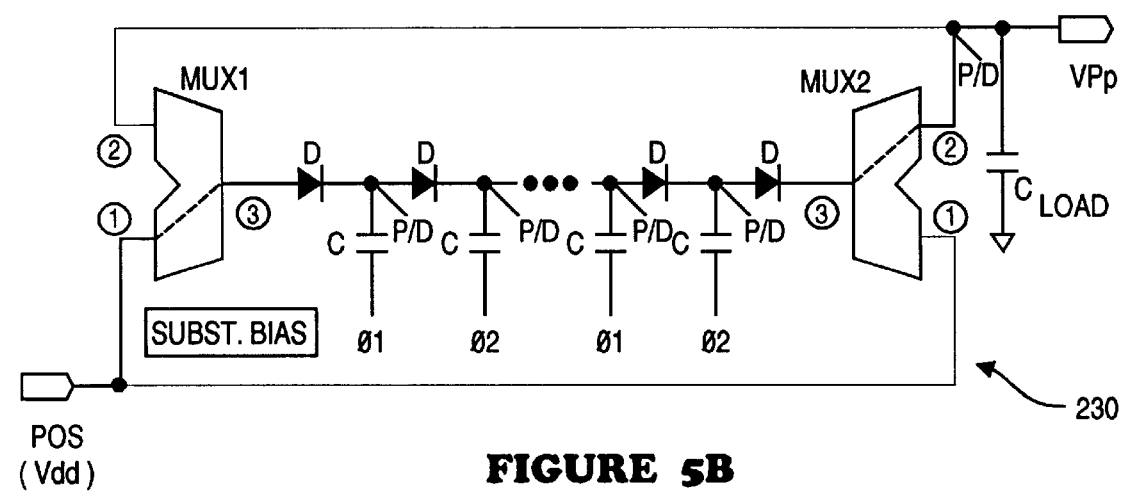
FIG. 5B depicts the circuit of FIG. 5A with the multiplexers switched to output positive high voltage.

FIG. 5B depicts the operational configuration when circuit 230 is to output positive high voltage. The dotted lines within each MUX depict the relevant MUX switching, and circuit paths shown with thin lines depict portions of the circuit that are unused in this mode of operation. As shown in FIG. 5B, MUX1 connects together its nodes 3 and 1, which provides Vdd to the anode node of the series-connected rectifier stages. MUX2 connects together its nodes 3 and 2, which delivers $V_{Pp}$ from the cathode node of the series-connected rectifier stages to the load capacitor.

Figure 5C:
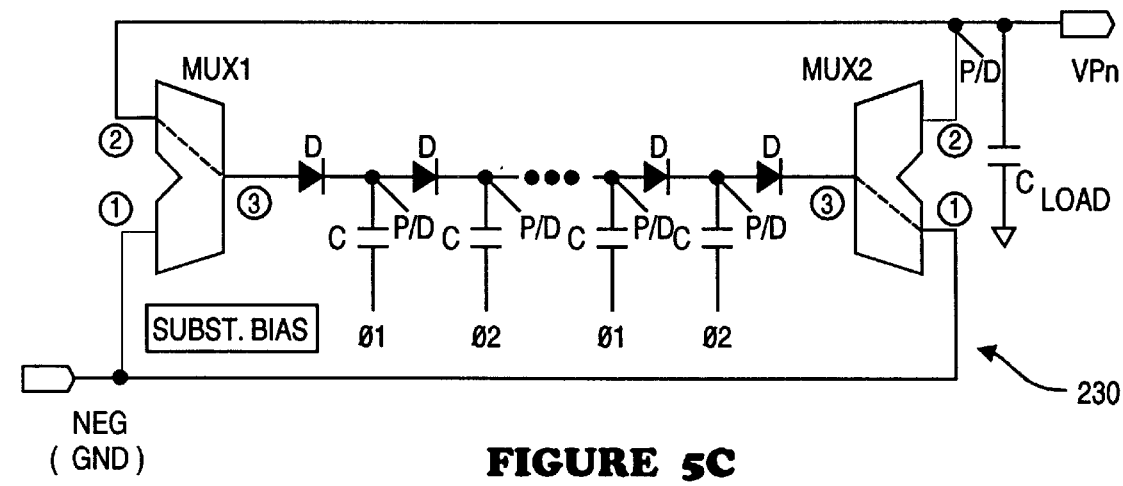
FIG. 5C depicts the circuit of FIG. 5A with the multiplexers switched to output negative high voltage.

FIG. 5C depicts the operation configuration when circuit 230 is to output negative high voltage. As shown, MUX1 now connects together its nodes 2 and 3, which will deliver $V_{Pn}$ to the load capacitor. MUX2 connects together its nodes 3 and 1, which is connected to ground.

Several factors determine the number N of rectifying or pumping stages required to achieve a desired magnitude of output high voltage $V_{Pp}$ or $V_{Pn}$. One factor is the magnitude of the low voltage power supply Vdd, which typically determines the voltage transition E1 associated with the phase signals. A large magnitude of E1 can reduce the number of required stages N. The number of stages N will increase as output load current and/or magnitude of $C_{LOAD}$ increase. Increasing the magnitude of the individual capacitors C1, C2 . . . CN+1 and to a lesser extent the magnitude of any Vt-cancellation capacitors C1A, C2A . . . CNA can decrease N, but at the expense of devoting more IC chip area to fabricating larger capacitors. Increasing the frequency of the phase waveforms enhances pump efficiency and can decrease N. Further, the magnitude of the Vt threshold voltage associated with each rectification stage (unless Vt cancellation is provided) affects N in that larger uncancelled Vt voltage dictate a larger N.

In the preferred embodiment, each capacitor C was in the 2 pF to 10 pF range, $C_{LOAD}$ was about 1000 pF, 1.2 VDC≦Vdd≦5 VDC, although larger magnitude Vdd could be used. In practice N=4 stages may be used, with a 10 MHz to 20 MHz two-phase pair of phase signals.

Figure 6A:
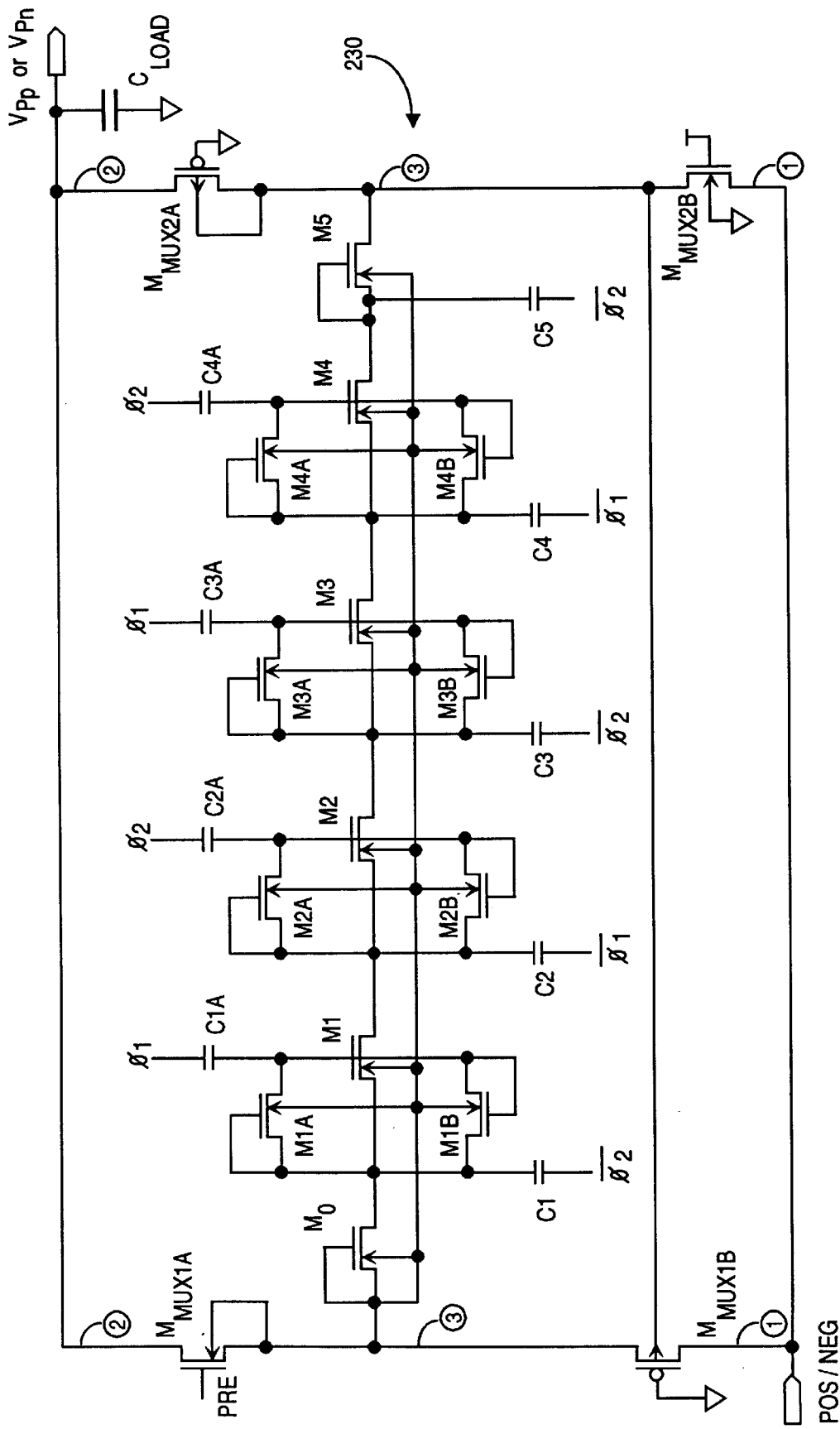
FIG. 6A depicts a five-stage two-phase positive/negative high voltage pump circuit with four-stage Vt cancellation, according to the present invention.

FIG. 6A shows a preferred embodiment of a two-phase positive/negative high voltage pumping circuit 230, in which Vt cancellation is provided for each series-coupled NMOS transistor in the string of rectifier stages. NMOS transistors M1, M2, M3, M4 and M5 together with capacitors C1, C2, C3, C4, C5 comprise an N=5 stage pump circuit. The output of this circuit is either $V_{Pp}$ or $V_{Pn}$, depending upon the on/off states of transistors MUX1A and MUX1B, which together comprise MUX1, and transistors MUX2A and MUX2B, which together comprise MUX2. Circled node numbers in FIG. 6A are analogous to the MUX input/output node numbers shown in FIGS. 5A–5C.

As described below, a Vt-cancellation pair of transistors MnA, MnB, and associated capacitor CnA is provided for M1, M2, M3 and M4, to boost voltage-multiplication efficiency. Typically, for a configuration having N stages of rectification, there will be (N−1) pairs of Vt-cancelling transistors, and (N−1) capacitors CnA. Transistor pairs MnA and MnB function as cross-coupled diodes that dynamically control the ultimate voltage differential between the drain and gate of associated transistor Mn to within |Vtn|.

In the embodiment shown, all transistors are NMOS except for MUX transistors $M_{MUX1B}$ and $M_{MUX2B}$. The use of NMOS transistors in the string of rectifier stages is advantageous in that hole mobility of PMOS transistors is substantially less than electron mobility in NMOS transistors.

Note that the substrates of transistors M0 and well as all NMOS transistors in the rectifier string are coupled together to a common substrate node, shown as node 3, which is also the anode node for the series-coupled string of rectifier stages. To prevent substrate-source/drain junction current flow, the substrates are MUX-switched to an appropriate voltage that is Vdd in positive high voltage mode (e.g., when outputting $V_{Pp}$) or to $V_{Pn}$ in negative high voltage mode (e.g., when outputting $V_{Pn}$).

In positive high voltage mode, within MUX1, $M_{MUX1A}$ is off, $_{MUX1B}$ is on, whereas within MUX2, $M_{MUX2A}$ is on, and $M_{MUX2B}$ is off, which is analogous to FIG. 5B. In positive high voltage mode, transistors M-MUX1B and M-MUX2B preferably precharge the $V_{Pp}$ node to Vdd-Vtn rather than ground, which significantly reduces charging time. During precharge, the gate voltage to transistor M-MUX1A is set to PRE=Vdd, and is ground otherwise. In this fashion, performance is enhanced, and no dedicated pull-up or pull-down transistors are required.

In negative high voltage mode, within MUX1, $M_{MUX1B}$ is Off, $_{MUX1A}$ is on, and within MUX2, $_{MUX2A}$ is off, but $M_{MUX2B}$ is on, which is analogous to FIG. 5C. During precharge, the $V_{Pn}$ node is charged by transistors M-MUX1A and M-MUX1B to Vtp (e.g., a PMOS threshold voltage level).

Figure 6B:
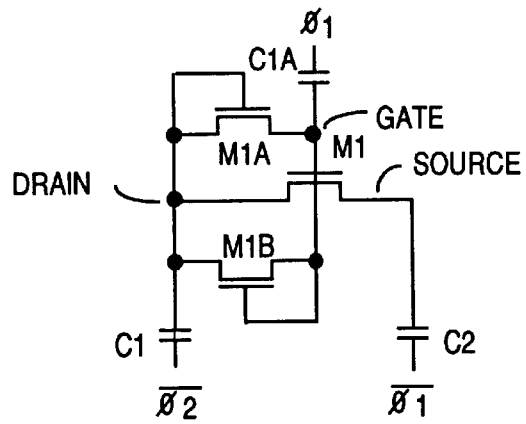
FIG. 6B depicts one charging stage and associated Vt-cancelling components from the circuit of FIG. 6A.
Figure 6C:
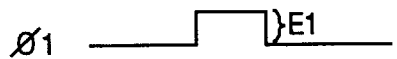
FIGS. 6C–6E depict typical phase waveforms for the circuit of FIG. 6A.
Figure 6D:
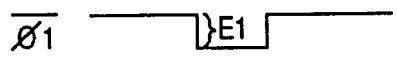
Figure 6E:

Assume that the configuration of FIG. 6A is in high voltage mode, e.g., the substrates are coupled by $_{MUX1B}$ to Vdd, and a high positive potential $V_{Pp}$ is to be delivered to $C_{LOAD}$. FIG. 6B replicates one stage of FIG. 6A showing one NMOS transistor (M1) and its associated cross-coupled diode Vt-cancelling transistors M1A, M1B, and capacitors C1, C1A, and C2. FIGS. 6C–6H depict voltage waveforms for various nodes of the circuit. In FIG. 6B, the gate, source and node designations refer to the rectifying or charging transistor M1. As shown by FIGS. 6C and 6E, the two phase waveforms ø1, and ø2 (and their respective complements) are non-overlapping in that voltage waveform transitions do not coincide between the phases. It will be assumed that the 0 to 1 voltage peak of each waveform is E1 volts, and that E1≈Vdd, where Vdd may have a magnitude between 1.2 VDC to about 5 VDC or higher. In the preferred embodiment, Vdd≈2.5 VDC.

In FIG. 6A, there will be preferably (N−1) capacitors C1A, C2A, C3A, C4A that mainly function to generate voltage peaks employed in cancelling Vt of associated rectifier stage NMOS transistors. The value of these Vt-cancellation capacitors C1A . . . C(N−1)A preferably will be in the few pF range, perhaps about 2 pF. By contrast, the charge pumping capacitors per se, C1, C2, C3 . . . CN will be larger, e.g., about 10 pF. The channel width/length ("W/L") ratios for the Vt cancelling transistors, e.g., M1A, M1B, etc. will be about 30/1.2, whereas W/L for the charge pumping transistors in the rectification stage (e.g, M1, M2, . . . MN) will be about 90/1.2. The AC load current provided to $C_{LOAD}$ will vary as a function of time, as a function of phase operating frequency, magnitude of $C_{LOAD}$, magnitude of capacitors used to implement the circuit, MOS fabrication process variations, ambient temperature, among other variables. However, scaled simulations predict that the preferred embodiment can deliver load current in the few mA range, e.g., perhaps 5 mA or more.

Figure 6F:
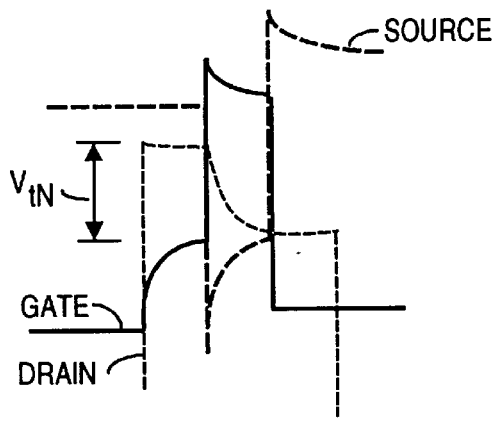
FIG. 6F depicts voltage waveforms for the charging stage NMOS shown in FIG. 6B before saturation, when the circuit of FIG. 6A is configured to output positive high voltage.

Referring to FIGS. 6B and 6F, before $V_{Pp}$ saturation occurs, the waveforms in FIG. 6F reflect that for one-half a charge pump cycle, high voltage charge will pass from source-to-drain in the rectification stage NMOS transistors. For the next-half pump cycle, the charge at the source will remain trapped, to await the next half-pump cycle.

The gate node is coupled to ø1, and on 0 to 1 ø1 transitions, the gate node voltage is raised higher than the drain node. As a result, charge can flow through diode M1B from the gate to the drain node until the gate node is Vtn more positive than the drain node. (At "steady state", Q=CΔV/Δt=0, where Q is transferred charge, C is effective capacitance gate-to-source, and t is time.) As the gate node rises due to the positive ø1 transition, the source node falls due to the negative complement signal $\overline{ø1}$ transition. Thus, the gate of M1 is more positive than the drain, which is more positive than the source. As a result, M1 turns on and transfers charge from drain to source.

As the charge transfers, the drain voltage drops. This implies that charge is also transferred from gate to drain to maintain gate potential at least Vtn higher than drain potential, to ensure M1 can conduct high drain-source current. The gate, source and drain nodes of M1 will experience automatic charge flow until the source and drain voltages of M1 equalize. Stated differently, the described two-phase Vt-cancellation indeed results in zero voltage drop across the source and drain of transistor M1.

Note in FIG. 6F that pre-saturation, the source node is pumped-up one Vdd (or E1) magnitude higher than the drain node, providing that capacitors C1, C2 are sufficiently large to accommodate 100% coupling. Thus, when the M1 drain node is pumped-up positively (e.g., by $\overline{ø2}$), the source node will be pumped sufficiently negatively (e.g., by $\overline{ø1}$) to dump charge from drain to source. This transfer is accomplished as the gate node voltage will have been pumped sufficiently high (e.g, by ø1) to fully pass the charge on the drain node to the source node.

During the next-half pumping cycle, when the drain is pulled negatively while the source is pulled positively, the gate voltage will turn-off pump transistor M1. With M1 now off, charge at capacitor C1 at the drain, and charge at capacitor C2 at the source are trapped or stored. However, on the next half-cycle, M1 turns on, and the storage charge results in a transfer from drain to source. The resultant drain-source current flow (i) pumps-up the voltage (V) across C2, e.g., i=C2ΔV/Δt.

Figure 6G:
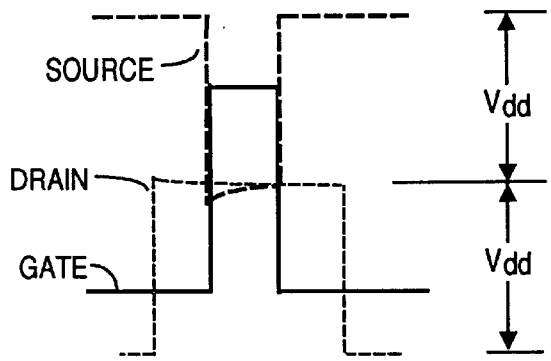
FIG. 6G depicts voltage waveforms for the charging stage NMOS shown in FIG. 6B after saturation, when the circuit of FIG. 6A is configured to output positive high voltage.

After a time period that typically is less than 1 ms, the output voltage $V_{Pp}$ saturates in that it can go no more positive. The relevant waveforms for saturation mode are shown in FIG. 6G.

SPICE (Simulation Program with Integrated Circuit Emphasis) simulation analysis of FIG. 6A using Vdd=2.5 V showed +3.9 VDC at the node defined by M1-C1, +6.4 VDC at the M2-C2 node, +8.9 VDC at the M3-C3 node, +11.4 VDC at the M4-C4 node, and 11.9 VDC at the M5-C5 node. Since transistor M5 in FIG. 6A is not Vt-compensated, the output at MUX2 node 3 will be one Vtn less, or about 11.9 VDC. In negative high voltage mode, the SPICE simulation showed the circuit outputting −9 V from a 2.5 VDC Vdd.

In the SPICE simulations, the various capacitors C1, C2 . . . C5 were about 10 pF, as were capacitors C1A, C2A . . . C4A, C5A. Fabrication of the capacitors was assumed to be convention polysilicon level two over polysilicon level one with an oxide-nitride-oxide ("ONO") dielectric, or a level of polysilicon over a well having an oxide dielectric.

Figure 6H:
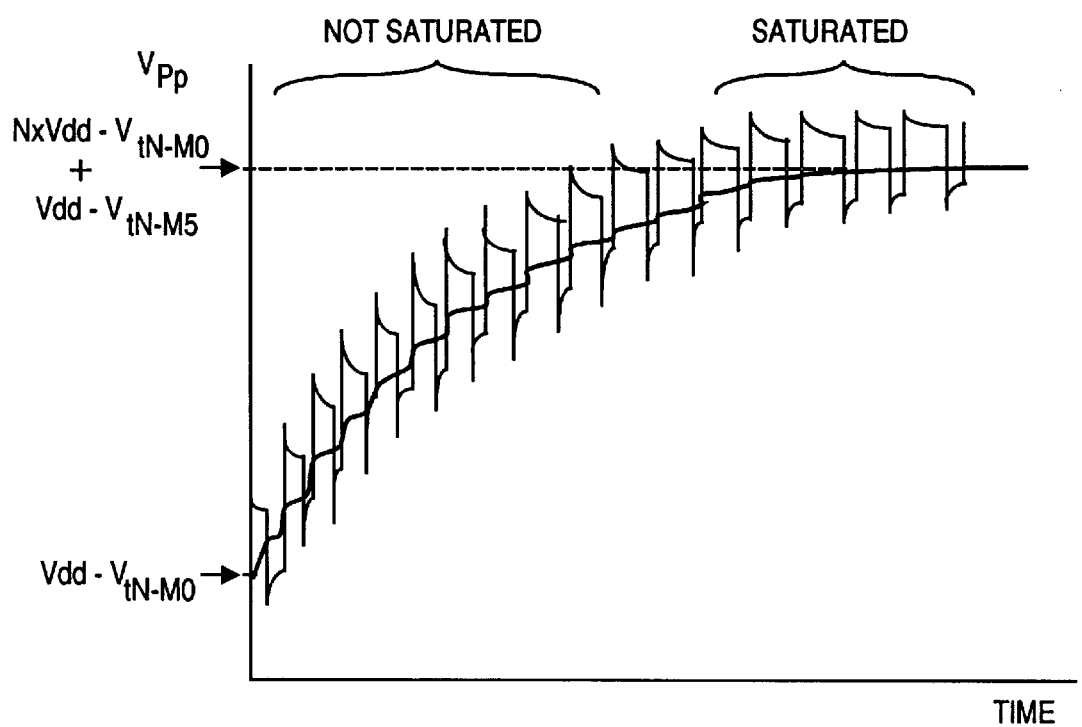
FIG. 6H depicts the positive high voltage output by the circuit of FIG. 6A for light and heavier capacitive loading.

As shown in FIG. 6H, the voltage $V_{Pp}$ appearing across the load capacitor will start out low, at Vdd-VtM0, where VtM0 is the source-drain threshold voltage drop for transistor M0, here assumed to be about 1 V. Thus, if Vdd is 2.5 VDC, the starting value for $V_{Pp}$ will be about 1.5 VDC. As the circuit operates, $V_{Pp}$ will increase with each charge cycle until after a time period, typically less than 1 ms, saturation occurs and the maximum output voltage is attained. For the N=5 stage configuration shown in FIG. 6A, the maximum output voltage will be {(N×Vdd-VtNM0)+(Vdd-VtN M5)}≈12 VDC, where VtNM0≈1 V and where VtNM5≈2 V (due to higher voltage-induced body effects). This relatively high output voltage results from the above-described Vt, with the sole VtN loss arising from the cathode-node NMOS transistor M5, which has no Vt voltage cancellation. The two waveforms shown in FIG. 6H reflect larger and smaller values of $C_{LOAD}$. The larger values of load capacitor provide better low pass filtering, and the $V_{Pp}$ waveform is smoother. By contrast, smaller values of $C_{LOAD}$ provide less filtering, as shown by the "spikier" waveform in FIG. 6H.

As noted, Vt cancellation in the present invention is achieved with two-phase drive waveforms, as opposed to the four-phase waveforms required by prior art FIG. 3C. The embodiment of FIG. 6A uses one pair of cross-coupled diodes implemented as parallel-coupled Vt-cancelling transistors per pump stage, whereas prior art FIG. 3C used only a single Vt-cancelling transistor per pump stage. However whereas prior art FIG. 3C required four-phases, the embodiment of FIG. 6A can cancel Vt using only two-phases. Two-phase operation is cost-efficient in that design of phase generator 240 is simplified, and higher repetition rate operation is achieved as well. A higher repetition frequency for the non-overlapping two-phase phase signals implies that the various capacitances within the positive/negative high voltage pump circuit could themselves be reduced somewhat, which further saves IC chip area.

It will be appreciated that the positive/negative high voltage pump circuit of FIG. 6A could be implemented with other Vt-cancellation techniques, or indeed with no Vt-cancellation. Of course, eliminating Vt-cancellation would decrease voltage multiplication in that the number of stages N would have to be increased to compensate for the N×Vt voltage drops that would be present.

Although FIGS. 6A and 6H have been described in detail with respect to outputting positive high voltage, those skilled in the art will appreciate that negative high voltage can similarly be generated in an efficient manner.

As good as the configuration of FIG. 6A is, it will be appreciated that this five-stage charge pump suffers a Vt loss for transistor M0 and for M5 as these two transistors are not provided with Vt cancellation. Because M5 sees higher potential than M0, its body effect will be greater, and whereas Vt for M0 is perhaps 1 V, Vt for M5 will be about 2 V, if body charge is taken into account. Therefore, approximately 3 V is lost because of uncompensated Vt drops in the configuration of FIG. 6A.

Figure 7A:
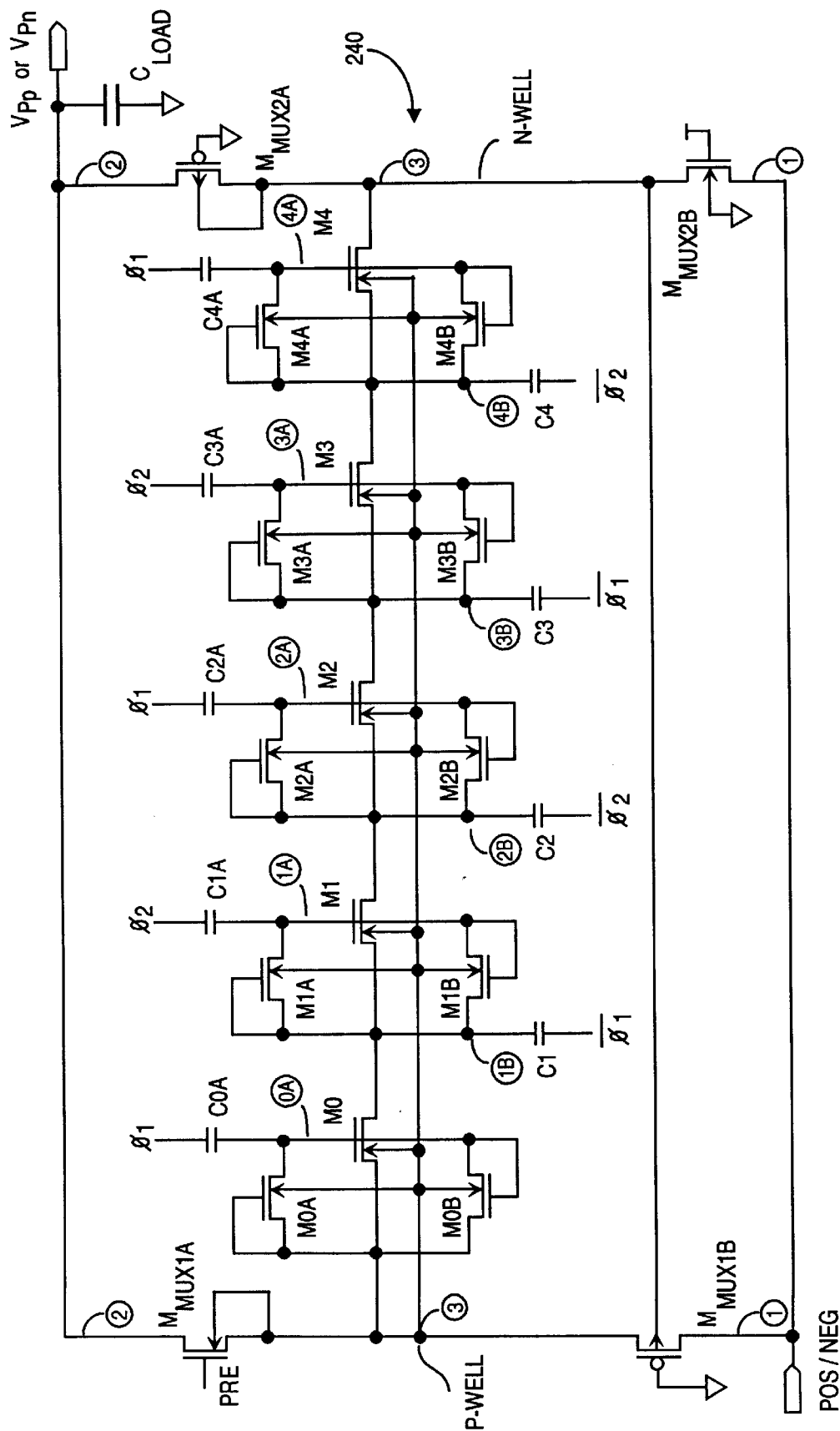
FIG. 7A depicts a four-stage two-phase positive/negative high voltage NMOS pump circuit with Vt-cancellation for each stage and with capacitor node precharging/discharging and substrate protection, according to the present invention.

FIG. 7A depicts a more preferred embodiment in which the input and output transistors (corresponding to transistors M0 and M5 in FIG. 6A) are provided with Vt-cancellation. As a result, the four-stage configuration of FIG. 7A can output greater potential than the five-stage configuration of FIG. 6A. More specifically, in positive mode, the configuration of FIG. 7A outputs $V_{Pp} \approx 5 \times \text{Vdd}$ or about +12.5 V for Vdd=2.5 V, and in negative mode, $V_{Pn} \approx -5 \times \text{Vdd}$ or −12.5 V, again for Vdd=2.5 V.

Figure 7B:
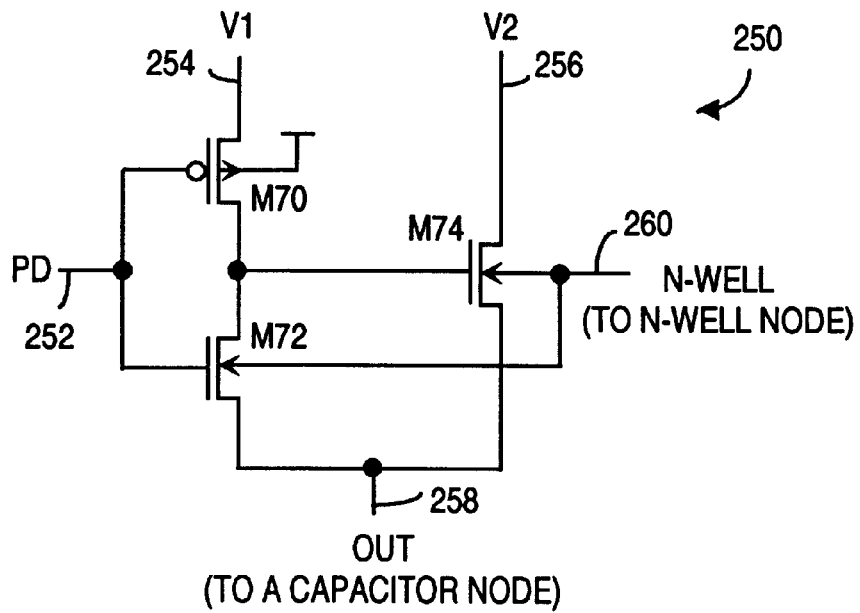
FIG. 7B depicts a first embodiment of a three-transistor precharge/discharge circuit, such as preferably is used to discharge capacitor nodes and load capacitor load, according to the present invention.
Figure 7C:
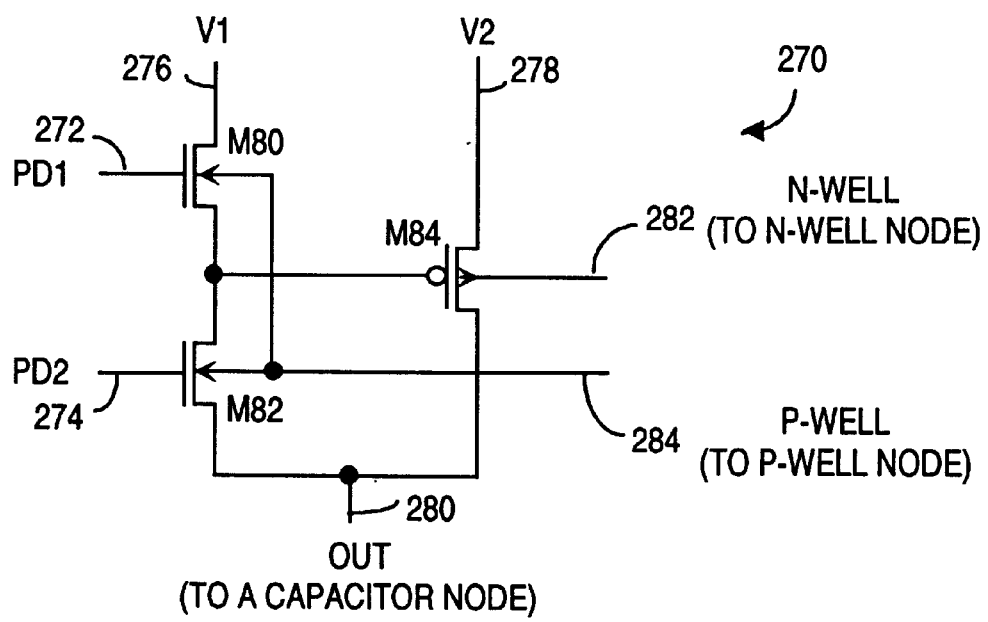
FIG. 7C depicts a second embodiment of a three three-transistor precharge/discharge circuit that discharges trapped capacitor voltages to Vtp, according to the present invention.

In FIG. 7A, the capacitor nodes are identified as 0A, 1A, 2A, 3A, 4A, 1B, 2B, 3B and 4B. Preferably coupled to each of these nodes is the output terminal of a precharge/discharge circuit 250 such as shown in FIG. 7B or a precharge/discharge circuit 270 such as shown in FIG. 7C. Further, the output terminal of a circuit 250 or 270 is also coupled to the $V_{Pp}/V_{Pn}$ output node to discharge the load capacitor.

As shown in FIG. 7B, circuit 250 includes PMOS transistor M70 and NMOS transistors M72, M74. Inputs to circuit 250 are a precharge/discharge logic signal ("PD") at input port 252, and voltages V1 and V2 at ports 254, 256. Circuit 250 output an output signal at port 258 that is coupled to one of the capacitor nodes in FIG. 7A, and outputs an N-well potential at port 260. The N-well potential is coupled to node 3 associated with transistor M4 in FIG. 7A. Table 1 below depicts the logical functioning of precharge/discharge circuit 250.

TABLE 1

| PD/V1/V2 | Positive Voltage | Negative Voltage |
|---|---|---|
| Precharge | 0 V/Vdd/Vdd | Vdd/0 V/0 V |
| Discharge | 0 V/Vdd/0 V | 0 V/Vdd/0 V |

For the configuration of FIG. 7A, it is understood that preferably there will be nine circuits 250, e.g., one circuit for each of the nine nodes 0A, 1A . . . 3B, 4B, and a tenth circuit to the output node, coupled to the load capacitor.

Referring to Table 1 and FIG. 7B, during precharge for $V_{Pp}$ generation, logic signal PD will be ground, and V1 and V2 will each be Vdd, whereas for $V_{Pn}$ generation, PD will be Vdd, and V1 and V2 will each be ground. In positive mode (e.g., when circuit 240 is to output $V_{Pp}$) the output signal from a circuit 250 will precharge the associated node, e.g., node 0A, to Vdd-Vtn before voltage pumping voltage. In negative mode, the various circuits 250 will precharge their associated node to Vtp before pumping voltage. It will be appreciated that such voltage presetting or precharging advantageously saves time in that the maximum peak output voltage will be attained in less time.

In discharge, for $V_{Pp}$ or for $V_{Pn}$ generation, PD and V2 will be ground, and V1 will be Vdd. Discharge operation is such that the output ports 258 of the various circuits 250 will discharge the potential at the associated node (e.g., node 0A, or node 1B, etc.) to ground, 0 V, when pump circuit 240 is inactive. Such discharging removes the positive or negative charge that would otherwise remain trapped in capacitors C0A, C1A, C2A, C3A, C4A, C1, C2, C3, and C4. Understandably, such trapped charges can create undesired high potential differences between nodes and peripheral circuitry, and can subject associated MOS devices to voltage breakdown.

An alternative precharge/discharge circuit 270 is shown in FIG. 7C as including NMOS transistors M80 and M82, and PMOS transistor M84. Inputs to circuit 270 are first and second precharge/discharge logic signals ("PD1" and "PD2") at input ports 272, 274, and voltages V1 and V2 at ports 276, 278. Circuit 270 provides an output signal at port 280 that is coupled to one of the capacitor nodes in FIG. 7A, and outputs N-well and P-well potentials at ports 282, 284. The N-well and P-well potentials are coupled to the corresponding well nodes in FIG. 7A. One advantage of the configuration of FIG. 7C is that trapped positive or negative charges are discharged to Vtp rather than to ground (as was the case for the circuit of FIG. 7B). Table 2 below depicts the logical functioning of precharge/discharge circuit 270.

TABLE 2

| PD1/PD2/V1/V2 | Positive Voltage | Negative Voltage |
|---|---|---|
| Precharge | 0 V/Vdd/Vdd/Vdd | 0 V/Vdd/Vdd/0 V |
| Discharge | Vdd/0 V/0 V/0 V | 0 V/0 V/Vdd/0 V |

Similar to the above description of circuit 250, for the configuration of FIG. 7A, it is understood that preferably there will be nine circuits 270, e.g., one circuit for each of the nine nodes 0A, 1A . . . 3B, 4B, and a tenth circuit to discharge the load capacitor.

It will be appreciated from the above descriptions that precharge/discharge circuit 250 or 270 advantageously can use input signals (e.g., PD, PD1, PD2, V1, V2) that are ground or at Vdd potential. As such, no boost circuitry is required to provide these input signals, which may be generated from ordinary logic associated with the system of FIG. 4A, or may be generated elsewhere, off-chip for example. When discharging positive voltage, preferably the P-well is discharged before the voltage nodes are discharged. This discharge sequence avoids the problem of undesired forward current from P-well to N+ source/drain regions. Similarly, when discharging negative voltage, preferably the voltage nodes are discharged before the P-well.

Adding precharge/discharge circuits such as shown in FIGS. 7B, 7C to circuit 240 in FIG. 7A, or to circuit 230 in FIG. 6A can introduce some well-current difficulties. In FIG.

6A, for example, P-well potential to NMOS devices M0 ... M5 is accomplished through node 3 associated with M-MUX1A and M-MUX1B. When the circuit of FIG. 6A outputs $V_{Pp}$, P-well potential is presented by M-MUX1B, whose node 1 is coupled to Vdd. If precharge/discharge circuitry such as circuit 240 is used, source/drain nodes (in FIG. 7A denoted 1B, 2B, 3B, 4B) will be precharged to Vdd-Vtn, which can permit forward current to flow from the P-well of the NMOS devices to the N+ source/drain regions. Although any such forward current would occur only at the start of pumping, such current can create a risk of MOS latch-up.

Figure 8:
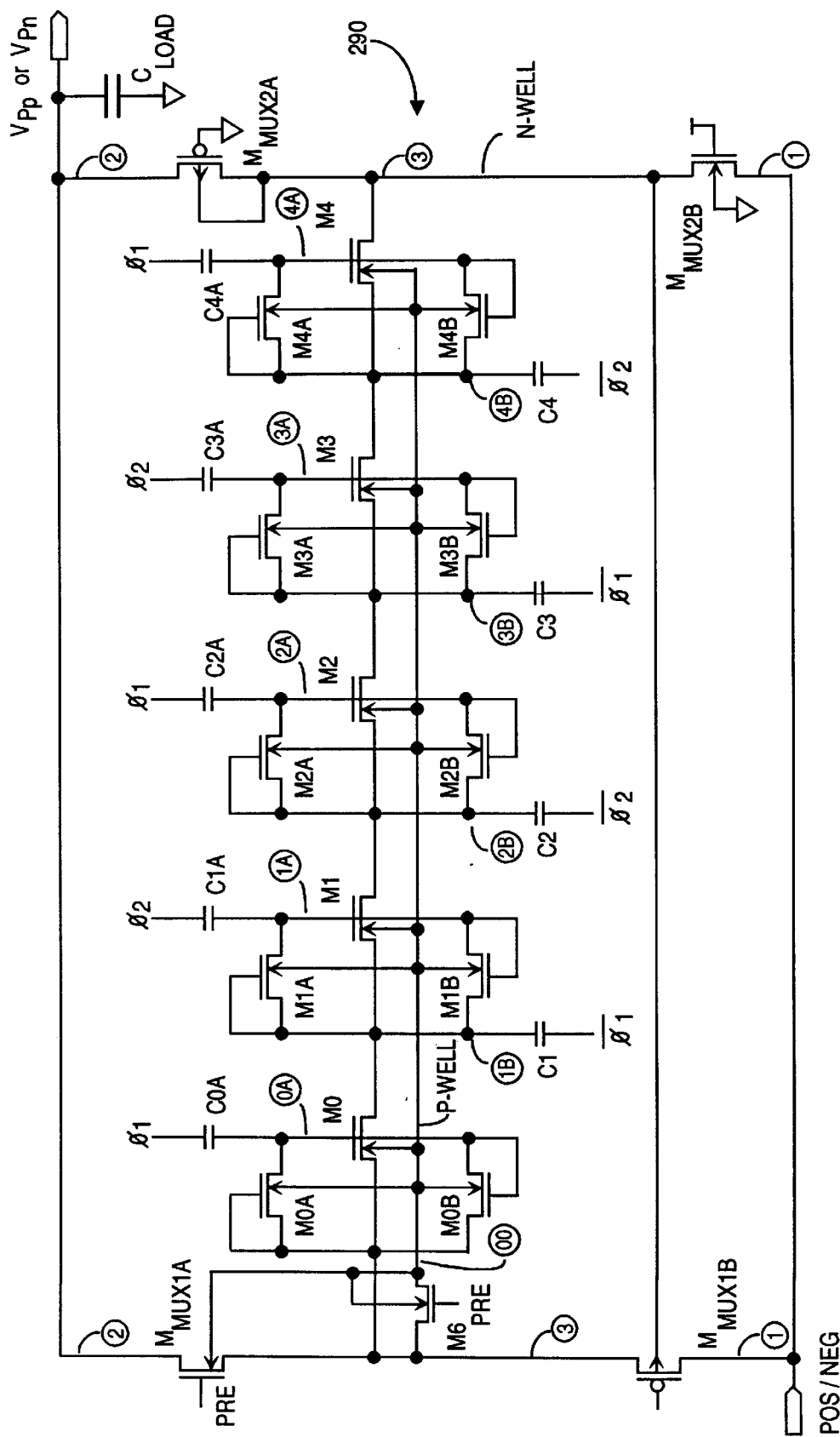
FIG. 8 depicts a four-stage two-phase positive/negative high voltage NMOS pump circuit with full Vt-cancellation, with capacitor node precharging/discharging and substrate protection, according to the present invention.

Such latch-up risk is reduced using circuit 290, whose configuration is depicted in FIG. 8. In this configuration, P-well potential for NMOS devices M0 ... M4 is not directly coupled to node 3 (associated with M-MUX1A, M-MUX1B, but instead is coupled via transistor M6. In this embodiment, devices M0–M4 preferably are fabricated within a common P-well. Precharge/discharge circuits are again coupled to each capacitor node, to the load capacitor, and preferably also to node 00 in FIG. 8A.

Thus, in positive mode when $V_{Pp}$ is to be output, the precharge/discharge circuit across node 00 is turned on, and NMOS M6 is turned off. This permits grounding the P-well while still permitting Vdd at node 1 of M-MUX1B to be applied to node 3 associated with M-MUX1A and M-MUX1B. If, for example, circuit 250 (FIG. 7B) is used with circuit 290 (FIG. 8), PD=ground, V1=Vdd, V2=Vdd will produce the desired positive voltage precharge condition (see Table 1).

When the circuit of FIG. 8 is in negative mode, the gate of M6 is coupled to PRE=Vdd to discharge the P-well potential from POS/NEG potential via transistor M-MUX1B to ground. The M6 gate is then coupled to ground to avoid voltage breakdown resulting from a too strong electric field across the associated gate oxide. The pump circuit 290 is then activated. Transistor M6 is on as its associated node 3 becomes pumped toward a negative voltage, and as a result the common P-well is coupled to the node 3 potential, which avoids forward current flow. If the precharge/discharge circuit shown in FIG. 7B is used, the precharge, negative mode voltage conditions will be PD=Vdd, V1=V2=ground (see Table 1). As seen from circuit 250 in FIG. 7B, the voltages V1, V2 are isolated from the P-well potential.

Figure 9A:
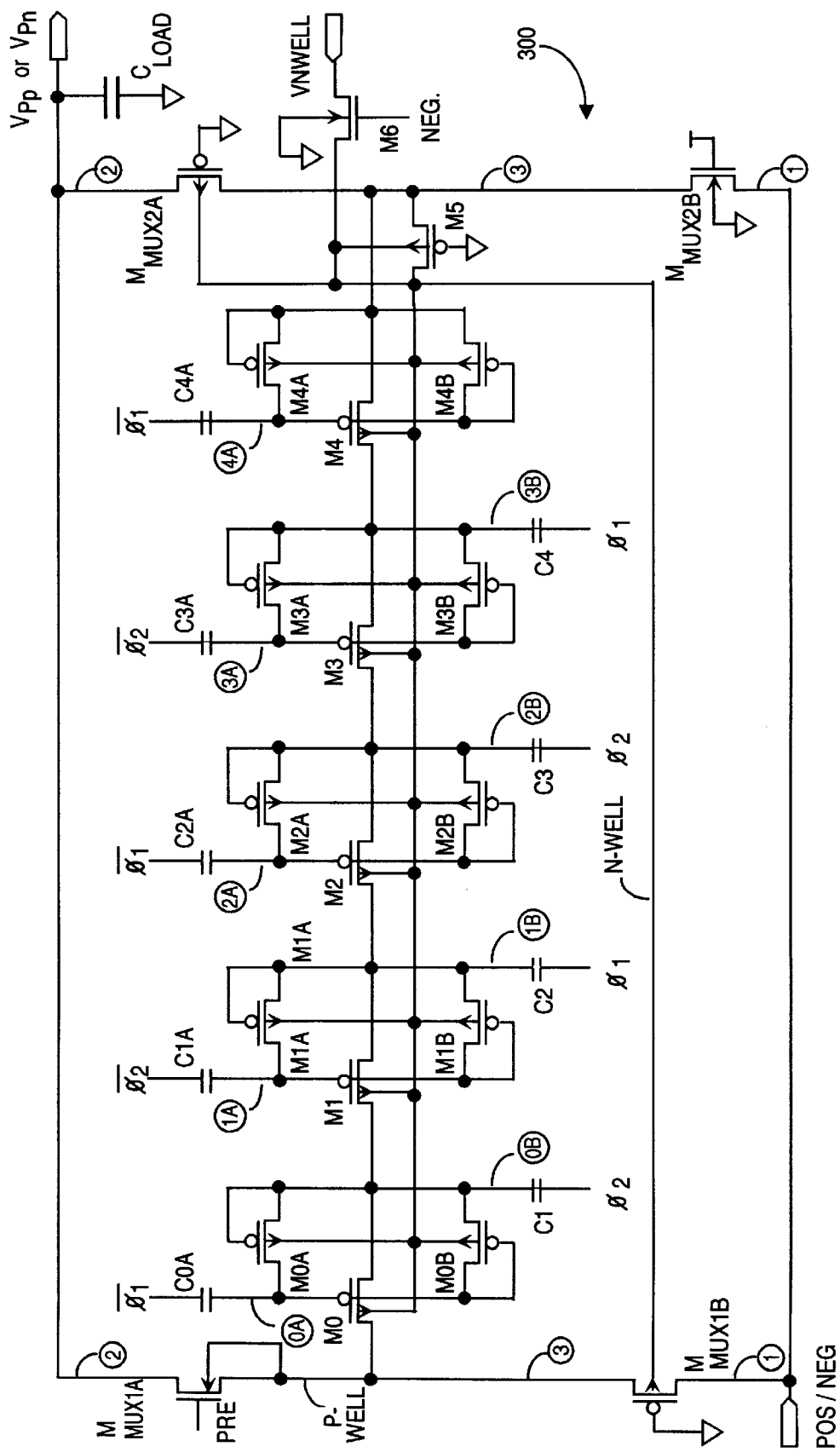
FIG. 9A depicts a four-stage two-phase positive/negative high voltage PMOS pump circuit with full Vt-cancellation for each stage, with capacitor node precharging/discharging and substrate protection, according to the present invention.

FIG. 9A depicts a PMOS version of a pump circuit 300 that is somewhat similar to NMOS circuit 290, depicted in FIG. 8. Preferably the PMOS transistors are fabricated in a common N-well which is coupled via transistor M5 to node 3, associated with MUX2 transistors M-MUX2A and M-MUX2B. This construction helps avoid forward current flow from the PMOS transistors' P+ source/drain regions to the N-well.

Preferably the various capacitor voltage nodes in circuit 300, including the load capacitor node, are provided with precharge/discharge circuits such as described with respect to FIGS. 7B and 7C. Such precharge/discharge circuits, used with the embodiment of FIG. 9A or other embodiments, can advantageously initially discharge voltage nodes to ground during negative mode operation. (It will be appreciated that 0 V is a more advantageous starting point than is a potential of VtN.) Then, when the pump circuit actively pumps each node negatively, the precharge/discharge circuits can switch back to precharge bias conditions, which can substantially shorten the time needed for the pump circuit to reach maximum output potential.

A circuit 450 (shown in FIG. 9B) outputs a VNWELL potential that is presented to the VNWELL port of circuit 300. NMOS transistor M5 can isolate this potential, however, from the preferably common N-well associated with the PMOS transistors in circuit 300.

In positive mode operation, node 3 (associated with MUX22 transistors M-MUX2A and M-MUX2B) will be pumped to positive high voltage $V_{Pp}$, and PMOS transistor M5 will be turned on. With M5 on, the N-well potential is coupled to node 3, which helps avoid forward current from the PMOS transistors' P+ source/drain regions to the preferably common N-well. When this is occurring, the gate of M6 is at ground, which turns-off M6, thus isolating the N-well from the VNWELL potential.

In negative mode operation, the POS/NEG node at the left side of FIG. 9A is ground, and 0 V will be coupled via transistor M-MUX2B to node 3 on the right side of FIG. 9A, associated with MUX2. Transistor M5 is now off, and the gate of M6 is coupled to Vdd, which turns-on M6, and couples VNWELL potential to the preferably common N-well. In terms of timing, preferably VNWELL causes Vdd to first be applied before 0 V is coupled to MUX2 node 3, to avoid forward current and device junction breakdown.

Figure 9B:
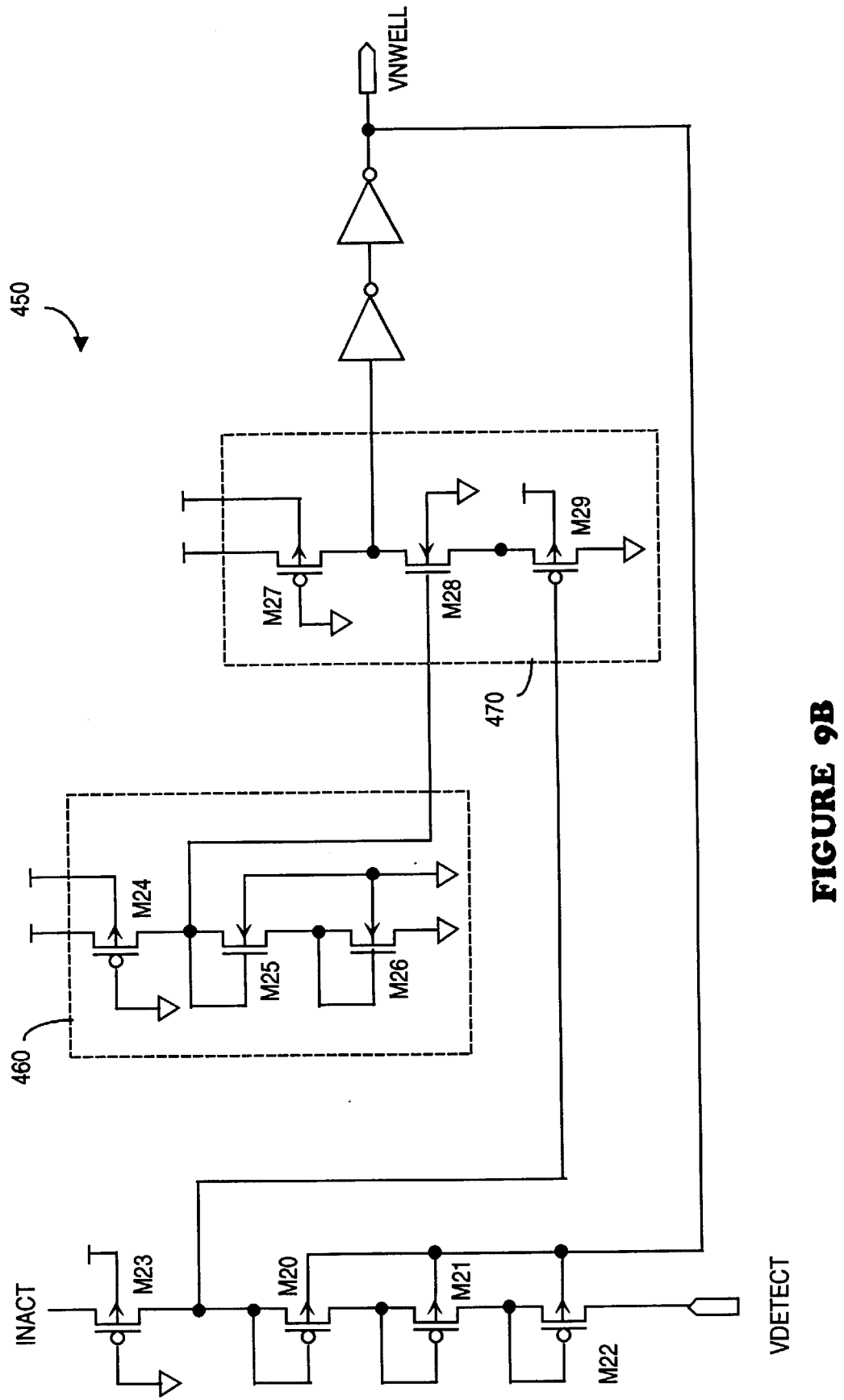
FIG. 9B depicts a preferred circuit for generating a VNWELL bias for the embodiment of FIG. 9A, according to the present invention.

FIG. 9B depicts a preferred embodiment of a switching circuit 450 for generating the VNWELL potential, referred to above. Referring back briefly to prior art FIG. 3C, it has been common practice to couple the N-well of PMOS devices to Vdd in negative high voltage pump circuits. However, when the P+ source/drain regions of the PMOS devices are pumped to negative high voltage the PN junction at the source/drain and well regions may breakdown due to the strong electric field.

Circuit 450 reduces such electric field problems by providing well potential in two steps. Initially during an inactive ("INACT") stage, the N-well of PMOS devices (e.g., those shown in FIG. 9A) is coupled to Vdd, to avoid forward current from source/drain regions to the well. Pump circuit (e.g., circuit 300 in FIG. 9A) is activated (e.g., complement of INACT), and in the second step, after a desired level of negative pumped potential is detected at the source/drain regions, the N-well is switched to ground. Grounding the N-well will now reduce electric fields between the junction of source/drain regions and the N-well, to minimize the risk of junction breakdown.

Circuit 450 also includes a bias generator, shown as 450, which here comprising devices M24, M25, M26, and also includes a logic element 470, comprising devices M27, M28, M29. The output from logic element 470 is buffered by a pair of inverters and is the VNWELL potential that is coupled to circuit 300 in FIG. 9A.

In FIG. 9B, when pump circuit 300 is inactive, the status signal INACT=Vdd, which charges the signal provided to the gate of transistor M28 to Vdd, turning off M28. But in charge pump active mode, INACT=ground, which discharges the gate potential of M28 to Vtp.

More specifically, circuit 450 includes a series-string of devices M20, and diode-coupled devices M21, M22, and M23. Collectively, M21, M22, M23 establish a potential of 3×Vpt, which when added to potential VDETECT, presents 3Vpt+VDETECT to the gate of M29. (VDETECT can correspond to a magnitude of detected PMOS P+ region source/drain voltage in circuit 300.) For example, if node 2B in FIG. 9A is detected (VDETECT), when the voltage of this node decreases to about −4.5 V, the gate voltage at M29 in FIG. 9B will be about 0 V. This gate potential turns-on M29, which switches the output potential VNWELL from Vdd to ground. Bias generator 460 provides a bias voltage to the gate of M5, which bias voltage is used to adjust a trip point for circuit 450.

Although many specific embodiments relating to positive/ negative voltage charge pumping, precharging/discharging circuits, substrate-well protection circuitry have been described, it will be appreciated that the basic architecture of the present invention is indeed flexible.

Figure 3B:
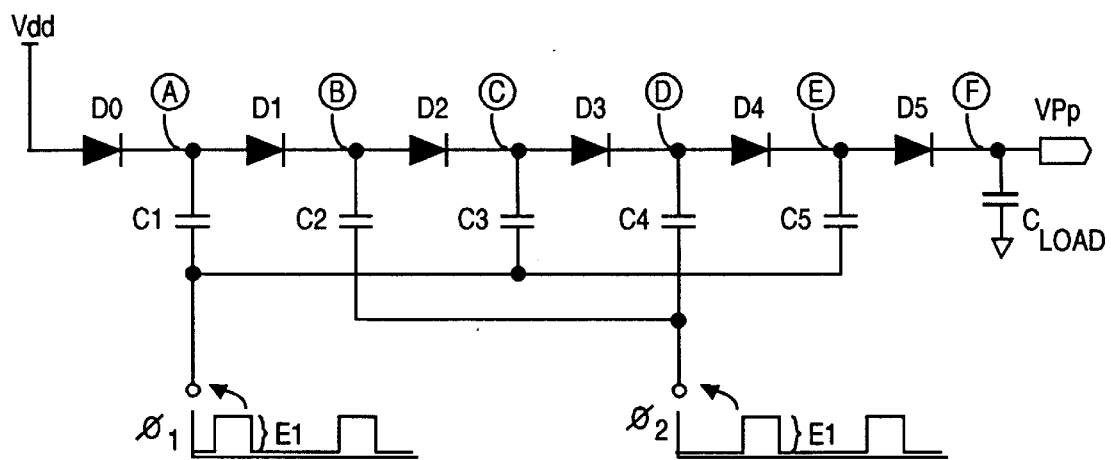
FIG. 3B depicts the diode-equivalent circuit of the configuration of FIG. 3A.
Figure 10A:
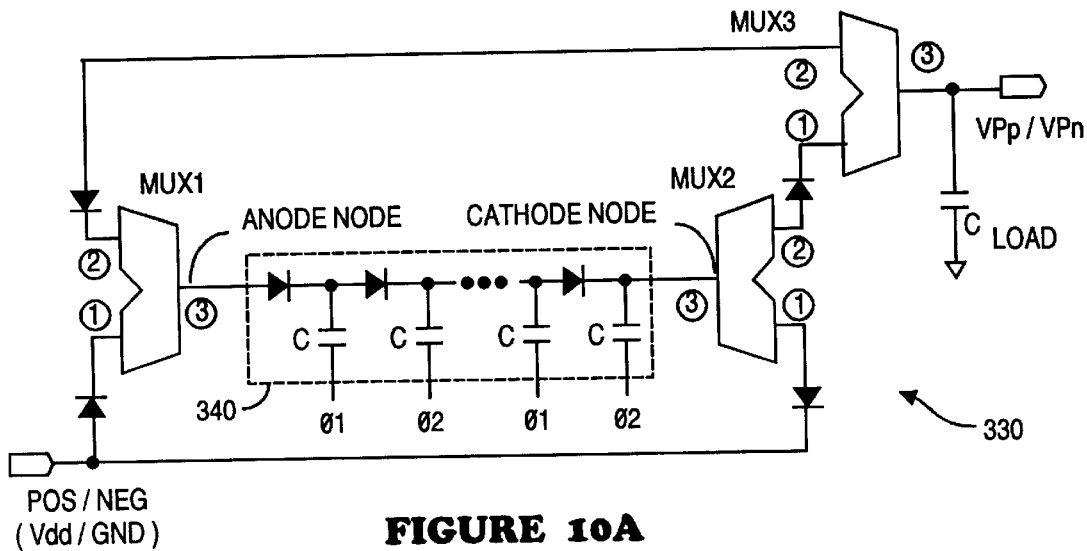
FIGS. 10A and 10B depict alternative system architectures for implementing the present invention.

For example, the architecture of FIG. 5A may be varied to produce positive or negative high voltage using a two-phase configuration that preferably includes Vt-cancellation, and/ or node charging/precharging, and/or substrate-well potential switching. In FIG. 10A, a positive/negative high voltage pump system 330 includes a preferably NMOS or PMOS implemented series of pump or rectifier stages and capacitors, shown collectively as 340, which stages preferably include Vt-cancellation. Of course other implementations of stages 340 could be used, including by way of example diodes, such as shown in FIG. 3B, the various other configurations shown herein, among numerous other circuits. In the embodiment of FIG. 10A, Vdd or ground are coupled to input node 1 of MUX1, through a diode. Input 2 of MUX1 is diode-coupled to input 2 of a third MUX, MUX3. Output node 3 of MUX1 is coupled to the anode node of pump stages 340, and the cathode node of stages 340 is coupled to output node 3 of MUX2. Input node 2 of MUX2 is diode-coupled to input node 1 of MUX3. Output node 3 of MUX3 delivers $V_{Pp}$ or $V_{Pn}$. For ease of illustration, FIG. 10A does not explicitly depict node voltage charging/discharging, or substrate-well switching, but these facets of the present invention may also be included.

Figure 10B:
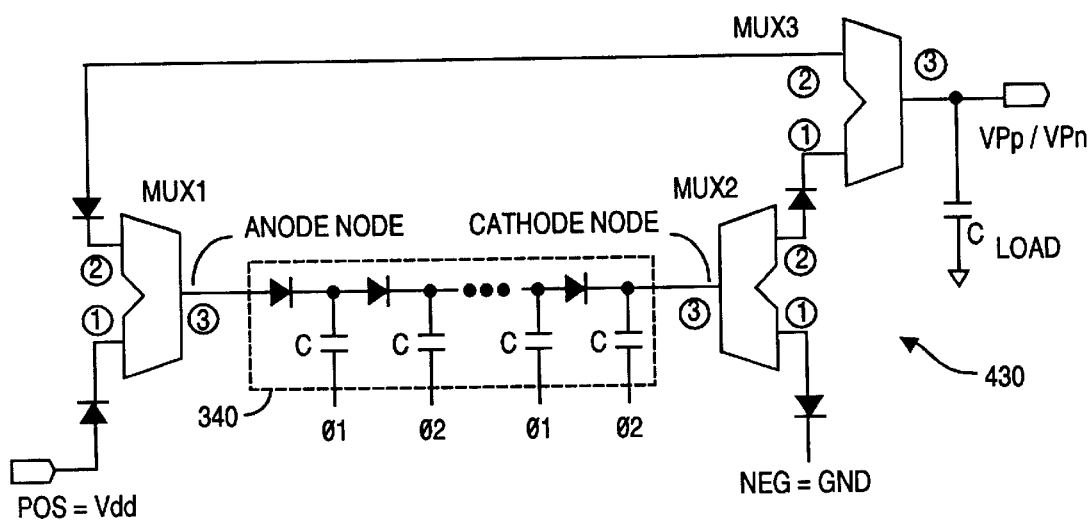

In the embodiment of FIG. 10B, node 1 of MUX1 is coupled to Vdd, and node 1 of MUX2 is coupled to ground. As before, a third MUX, MUX3, receives diode-coupled inputs from nodes 2 of MUX2 and MUX1, and outputs $V_{Pp}$ or $V_{Pn}$ to the load capacitor (not shown). Again it is to be understood, that pump stages 340 may be implemented using PMOS and/or NMOS transistors, diodes, etc., and capacitors. Again, while FIG. 10B does not explicitly depict node precharging/discharging, or substrate-well switching, these facets of the present invention may also be provided.

While the preferred embodiments have been described with respect to the use of two-way multiplexers, preferably implemented using CMOS devices, switch units other than multiplexers could of course be used.

Figure 11:
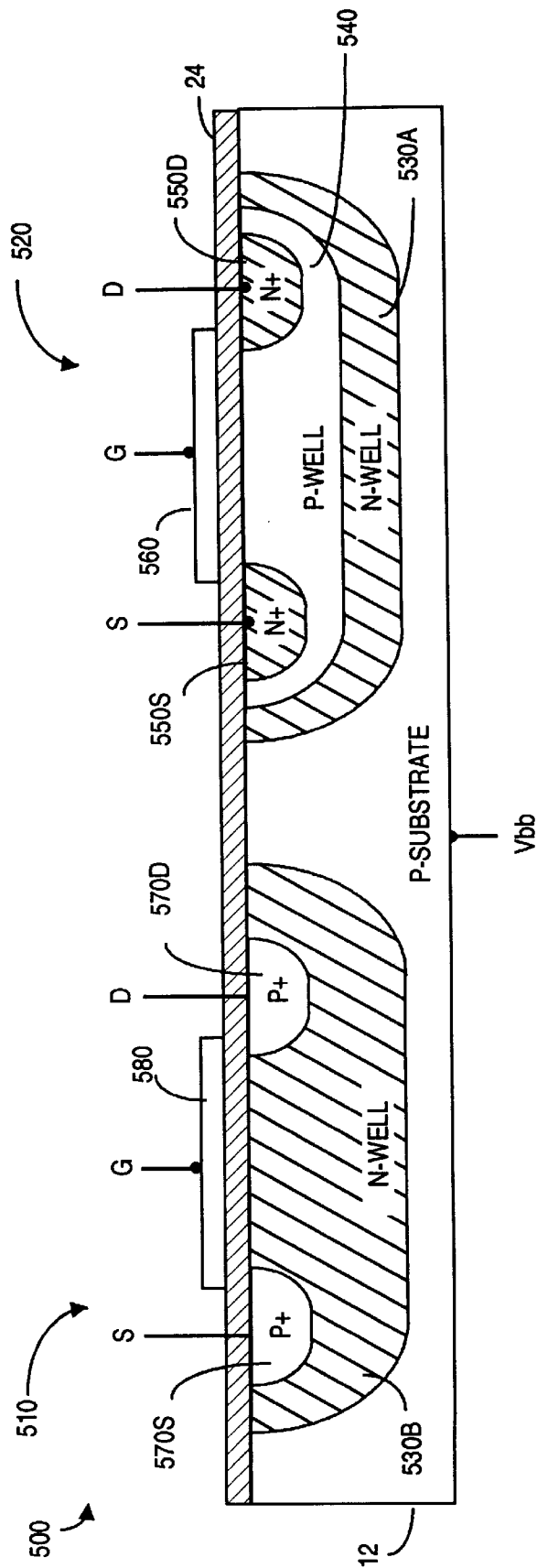
FIG. 11 depicts the multi-well fabrication preferably used to implement NMOS pump devices, according to the present invention.

As noted, for reasons of higher mobility the use of NMOS devices is preferred to PMOS devices, yet it is important to avoid a substrate-source/drain current flow. FIG. 11 depicts a portion of an IC 500 that includes a PMOS transistor 510 and an NMOS transistor 520, formed on a common P-substrate 12. NMOS transistor 520 is formed in an N-well 530A that contains a P-well 540. PMOS transistor 510 is formed within an N-well 530B that may be separate from N-well 530A (as shown), or indeed may be a portion of the same N-well 530A. NMOS transistor 520 has N+ source and drain regions 550S, 550D and a gate 560 overlying a thin oxide 24. PMOS transistor 510 has P+ source and drain regions 570S, 570D and a gate 580, also overlying a thin gate oxide 24. In the preferred embodiment, a positive/ negative charge pump is fabricated using NMOS and PMOS transistors, in which the NMOS transistors have a double-well configuration as shown in FIG. 10. In this fashion, substrate to drain/source current is avoided, when outputting $V_{Pp}$ or when outputting $V_{Pn}$.

Modifications and variations may be made to the disclosed embodiments without departing from the subject and spirit of the invention as defined by the following claims.

What is claimed is:

1. A high voltage charge pump operable from low voltage Vdd and electronically reconfigurable to output from an output port a positive high voltage $V_{Pp}$ in a positive mode, or a negative high voltage $V_{Pn}$ in a negative mode, comprising:

a semiconductor substrate;

a charge pump circuit, fabricated on said substrate, having an anode node and a cathode node and including a number (N) of series-coupled charge pump stages, each of said stages including a MOS transistor and being AC-coupled to receive one of two non-overlapping phase pulse train signals of amplitude E1, where E1≦Vdd, such that adjacent said stages receive different ones of said phase pulse train signals; said pump stages multiplying the AC-coupled E1 amplitude pulse train signals to create a larger magnitude potential therefrom; and a switching mechanism, fabricated on said substrate, coupled to said charge pump circuit;

wherein when said charge pump circuit is to operate in said positive mode, said switching mechanism couples a source of said Vdd to said anode node, couples said cathode node to said output port to deliver said $V_{Pp}$, and couples a substrate node of each said MOS transistor to a first potential; said larger magnitude potential created by said charge pump circuit having magnitude $V_{Pp}$; and wherein when said charge pump circuit is to operate in said negative mode, said switching mechanism couples a negative potential to said cathode node, couples said anode node to said output port to deliver said $V_{Pn}$, and couples a substrate node of each said MOS transistor to a second potential; said larger magnitude potential created by said charge pump circuit having magnitude $V_{Pnp}$.

2. The high voltage charge pump of claim 1, wherein said substrate is P-type material, and each said transistor is a PMOS transistor fabricated in an N-well fabricated in said substrate.

3. The high voltage charge pump of claim 1, wherein said substrate is P-type material, and each said transistor is an NMOS transistor fabricated in a P-well fabricated in an N-well fabricated in said substrate.

4. The high voltage charge pump of claim 1, wherein each said transistor is configured as a diode.

5. The high voltage charge pump of claim 1, wherein said switching mechanism includes a first two-way multiplexer unit (MUX1) and a second two-way multiplexer unit (MUX2); wherein:

said anode node is coupled to an output node of MUX1, and said cathode node is coupled to an output node of MUX2;

a first input node of MUX1 and a first input node of MUX2 are each coupled to Vdd in positive mode and are coupled to ground in negative mode; and a second input node of MUX1 and a second input node of MUX2 are each coupled to said output port to output said $V_{Pp}$ in positive mode, and to output said $V_{Pn}$ in negative mode.

6. The high voltage charge pump of claim 1, wherein said switching mechanism precharges said output port to a potential approximating (Vdd-Vt) in positive mode, and to a potential approximating Vt in negative mode, where Vt is threshold voltage for said MOS transistor.

7. The high voltage charge pump of claim 1, wherein:

said substrate is P-type material, and each said transistor is a PMOS transistor fabricated in an N-well fabricated in said substrate; and said switching mechanism includes a first two-way multiplexer unit (MUX1) and a second two-way multiplexer unit (MUX2);

wherein said anode node is coupled to an output node of MUX1, and said cathode node is coupled to an output node of MUX2; a first input node of MUX1 and a first input node of MUX2 are each coupled to receive Vdd in positive mode and ground in negative mode; a second input node of MUX1 and a second input node of MUX2 are each coupled to said output port to output said $V_{Pp}$ in positive mode, and to output said $V_{Pn}$ in negative mode;

and further including bias means. coupled to said N-well, for changing N-well potential as a function of positive mode or negative mode operation of said high voltage charge pump to protect said PMOS transistor against breakdown.

8. The high voltage charge pump of claim 1, wherein:

said substrate is P-type material, and each said transistor is an NMOS transistor fabricated in a P-well fabricated in an N-well fabricated in said substrate; and said switching mechanism includes a first two-way multiplexer unit (MUX1) and a second two-way multiplexer unit (MUX2);

wherein said anode node is coupled to an output node of MUX1, and said cathode node is coupled to an output node of MUX2; a first input node of MUX1 and a first input node of MUX2 are each coupled to receive Vdd in positive mode and ground in negative mode; and a second input node of MUX1 and a second input node of MUX2 are each coupled to said output port to output said $V_{Pp}$ in positive mode, and to output said $V_{Pn}$ in negative mode.

9. A high voltage charge pump system, fabricated on a semiconductor substrate, operable from low voltage Vdd and electronically reconfigurable to output from an output port a positive high voltage $V_{Pp}$ in a positive mode, or a negative high voltage $V_{Pn}$ in a negative mode, the system comprising:

a charge pump circuit, fabricated on said substrate, having an anode node and a cathode node and including a plurality of series-coupled solid-state charge pump MOS transistors AC-coupled to receive one of two pulse train signals of amplitude E1≦Vdd and to output a larger magnitude potential therefrom;

a switch mechanism, fabricated on said substrate, coupled to said charge pump transistors;

a bias circuit, fabricated on said substrate, coupled to said solid-state charge pump transistors so as to vary at least one of a substrate bias voltage and a well bias voltage thereof as a function of positive mode or negative mode operation of said system;

wherein when said system is to operate in said positive mode, said switch mechanism couples a source of said Vdd to said anode node, and couples said cathode node to said output port to deliver said $V_{Pp}$; said larger magnitude potential created by said charge pump circuit having a magnitude of said $V_{Pp}$; and wherein when said system is to operate in said negative mode, said switch mechanism couples a negative potential to said cathode node, and couples said anode node to said output port to deliver said $V_{Pn}$, said larger magnitude potential created by said charge pump circuit having a magnitude of said $V_{Pn}$.

10. The system of claim 9, wherein said solid state charge pump transistors are selected from a group consisting of (a) a PMOS transistor, (b) an NMOS transistor, and (c) a MOS transistor configured as a diode.

11. The system of claim 9, wherein said switch mechanism includes a first two-way multiplexer unit (MUX1) and a second two-way multiplexer unit (MUX2);

wherein said anode node is coupled to an output node of MUX1, and said cathode node is coupled to an output node of MUX2; a first input node of MUX1 and a first input node of MUX2 are together coupled to Vdd in positive mode and coupled to ground in negative mode; and wherein a second input node of MUX1 and a second input node of MUX2 are together coupled to said output port to output said $V_{Pp}$ in positive mode, and to output said $V_{Pn}$ in negative mode.

12. The system of claim 9, wherein said substrate is P-type material, and each of said solid-state charge pump transistors is a PMOS transistor fabricated in an N-well fabricated in said substrate.

13. The system of claim 12, wherein bias voltage varied by said bias circuit is potential at said N-well.

14. The system of claim 9, wherein said substrate is P-type material, and each of said solid-state charge pump transistors is an NMOS transistor fabricated in a P-well fabricated in an N-well in said substrate.

15. The system of claim 11, wherein at least one of said MUX1 and said MUX2 comprises a PMOS transistor series-coupled to an NMOS transistor.

16. The system of claim 9, wherein:

said substrate is P-type material, each of said solid state charge pump transistors is a PMOS transistor fabricated in an N-well fabricated in said substrate;

said switch mechanism includes a first two-way multiplexer unit (MUX1) and a second two-way multiplexer unit (MUX2), at least one of said MUX1 and MUX2 comprising a series-coupled PMOS transistor and an NMOS transistor;

wherein said anode node is coupled to an output node of MUX1, and said cathode node is coupled to an output node of MUX2; a first input node of MUX1 and a first input node of MUX2 are together coupled to Vdd in positive mode and to ground in negative mode; a second input node of MUX1 and a second input node of MUX2 are together coupled to said output port to output said $V_{Pp}$ in positive mode, and to output said $V_{Pn}$ in negative mode; and wherein said bias circuit varies bias potential at said N-well as a function of positive mode or negative mode operation of said system.

17. The system of claim 9, further including a phase generator, fabricated on said substrate, outputting said pulse train signals.

18. The system of claim 14, wherein bias voltage varied by said bias circuit is potential at said P-well.

19. A method of multiplying a low voltage Vdd in an electronically reconfigurable system whose output port provides a positive high voltage $V_{Pp}$ in positive mode, or a negative high voltage $V_{Pn}$ in negative mode, the method comprising the following steps:

providing a charge pump having an anode node and a cathode node and receiving AC-coupled pulse train signals of amplitude E1≦Vdd and multiplying said pulse train signals to create a larger magnitude potential therefrom; said charge pump including a plurality of series-coupled pump stages, each of said stages including a MOS transistor;

coupling a switchably reconfigurable switching mechanism to said charge pump such that:

when said charge pump is to operate in said positive mode, said switching mechanism coupling a source of said Vdd to said anode node, and coupling said cathode node to said output port to deliver said $V_{Pp}$; said larger magnitude potential created by said charge pump having magnitude $V_{Pp}$; and when said pump is to operate in said negative mode, said switching mechanism coupling a negative potential to said cathode node, and coupling said anode node to said output port to deliver said $V_{Pn}$; said larger magnitude potential created by said charge pump having magnitude $V_{Pnp}$; and coupling a substrate or well node of each said MOS transistor to a first potential when said pump operates in said positive mode, and coupling said substrate or well node of each said MOS transistor to a second potential when said pump operates in said negative mode.

20. The method of claim 19, wherein each said MOS transistor in said charge pump is a PMOS transistor fabricated in an N-well fabricated on a P-type semiconductor substrate upon which said switching mechanism is also fabricated; and wherein said node is coupled to said N-well such that N-well potential is varied as a function of positive mode or negative mode of said charge pump.

* * * * *

UNITED STATES PATENT AND TRADEMARK OFFICE
CERTIFICATE OF CORRECTION

PATENT : 6,023,188
DATED : February 8, 2000
INVENTOR(S) : Peter W. Lee, et al.

It is certified that error appears in the above-identified patent and that said Letters Patent is hereby corrected as shown below:

On the Cover Sheet:

Please insert the continuing data as follows:

--This is a continuation of application Serial No. 08/744,200, filed November 5, 1996, now abandoned.--

Signed and Sealed this

Fifteenth Day of May, 2001

Attest:

NICHOLAS P. GODICI

Attesting Officer

Acting Director of the United States Patent and Trademark Office

UNITED STATES PATENT AND TRADEMARK OFFICE
CERTIFICATE OF CORRECTION

| | | |
|---|---|---|
| PATENT NO. | : 6,023,188 | Page 1 of 1 |
| APPLICATION NO. | : 09/232115 | |
| DATED | : February 8, 2000 | |
| INVENTOR(S) | : Peter W. Lee et al. | |

It is certified that error appears in the above-identified patent and that said Letters Patent is hereby corrected as shown below:

Before "FIELD OF THE INVENTION" at column 1, line 3, please insert the following,

-- CROSS-REFERENCE TO RELATED APPLICATIONS

This application is a continuation of U.S. Patent Application No. 08/744,200, filed November 5, 1996 (now abandoned). --

Signed and Sealed this
Twenty-ninth Day of January, 2013

David J. Kappos
*Director of the United States Patent and Trademark Office*